(12) United States Patent
Sasaki et al.

(10) Patent No.: US 11,264,253 B2
(45) Date of Patent: Mar. 1, 2022

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Shinya Sasaki, Toyama (JP); Yukitomo Hirochi, Toyama (JP); Noriaki Michita, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/554,557

(22) Filed: Aug. 28, 2019

(65) Prior Publication Data

US 2020/0013646 A1 Jan. 9, 2020

Related U.S. Application Data

(63) Continuation of application No. PCT/JP2017/009610, filed on Mar. 9, 2017.

(51) Int. Cl.
*H01L 21/00* (2006.01)
*H01L 21/67* (2006.01)
(Continued)

(52) U.S. Cl.
CPC ...... *H01L 21/67115* (2013.01); *H01L 21/324* (2013.01); *H05B 6/68* (2013.01); *H05B 6/806* (2013.01)

(58) Field of Classification Search
CPC ... H01L 21/67115; H01L 21/324; H05B 6/68; H05B 6/806
See application file for complete search history.

(56) References Cited

U.S. PATENT DOCUMENTS 9,337,001 B2 * 5/2016 Ashida ............. H01J 37/32247
2004/0235281 A1 11/2004 Downey et al.
(Continued)

FOREIGN PATENT DOCUMENTS

JP 04-056090 A 2/1992
JP 05-090885 A 12/1993
(Continued)

OTHER PUBLICATIONS

International Search Report dated May 16, 2017 of the PCT International Application No. PCT/JP2017/009610.
(Continued)

*Primary Examiner* — Richard A Booth
(74) *Attorney, Agent, or Firm* — Volpe Koenig

(57) ABSTRACT

There is provided a technique includes: a process chamber in which a substrate is processed; a plurality of microwave supply sources configured to supply predetermined microwaves for heating the substrate in the process chamber; and a controller configured to control the microwave supply sources such that while keeping constant a sum of outputs of the microwaves respectively supplied to the substrate from the plurality of microwave supply sources, at least one of the plurality of microwave supply sources is turned off, and periods in which the at least one of the plurality of microwave supply sources is turned off are different from each other.

6 Claims, 17 Drawing Sheets

(51) Int. Cl.
 *H01L 21/324* (2006.01)
 *H05B 6/68* (2006.01)
 *H05B 6/80* (2006.01)

(56) References Cited

U.S. PATENT DOCUMENTS

| | | | |
|---|---|---|---|
| 2007/0167029 A1* | 7/2007 | Kowalski | H01L 21/02238 |
| | | | 438/769 |
| 2011/0168699 A1* | 7/2011 | Oomori | H05B 6/705 |
| | | | 219/748 |
| 2012/0061384 A1 | 3/2012 | Kasai et al. | |
| 2013/0062341 A1 | 3/2013 | Ashida | |
| 2015/0255317 A1 | 9/2015 | Suguro et al. | |

FOREIGN PATENT DOCUMENTS

| | | |
|---|---|---|
| JP | 2007-535174 A | 11/2007 |
| JP | 2012-084510 A | 4/2012 |
| JP | 2013-058652 A | 3/2013 |
| JP | 2015-070045 A | 4/2015 |
| JP | 2015-170662 A | 9/2015 |
| JP | 2016-186991 A | 10/2016 |
| KR | 2013-0028689 A | 3/2013 |

OTHER PUBLICATIONS

Korean Office Action dated Oct. 21, 2020 for Korean Patent Application No. 10-2019-7025508.
Japanese Office Action dated Oct. 27, 2020 for Japanese Patent Application No. 2019-504252.

* cited by examiner

FIG. 10

| Processing event | | POWER | Microwave introduction port | | | | | |
|---|---|---|---|---|---|---|---|---|
| | | | 653-1 | 653-2 | 653-3 | 653-4 | 653-5 | 653-6 |
| MW irradiation | MW-1 | 10kW | 0kW | 2kW | 2kW | 2kW | 2kW | 2kW |
| | MW-2 | 10kW | 2kW | 0kW | 2kW | 2kW | 2kW | 2kW |
| | MW-3 | 10kW | 2kW | 2kW | 0kW | 2kW | 2kW | 2kW |
| | MW-4 | 10kW | 2kW | 2kW | 2kW | 0kW | 2kW | 2kW |
| | MW-5 | 10kW | 2kW | 2kW | 2kW | 2kW | 0kW | 2kW |
| | MW-6 | 10kW | 2kW | 2kW | 2kW | 2kW | 2kW | 0kW |
| MW stop | | 0kW | 0kW | 0kW | 0kW | 0kW | 0kW | 0kW |

FIG. 11

| Processing event | | POWER | Microwave introduction port | | | | | | Processing time | |
|---|---|---|---|---|---|---|---|---|---|---|
| | | | 653-1 | 653-2 | 653-3 | 653-4 | 653-5 | 653-6 | | |
| Preheating (temperature raising) | MW irradiation | MW-1 | 10kW | 0kW | 2kW | 2kW | 2kW | 2kW | 2kW | 1 sec | Repeated 6 cycles for 36 sec |
| | | MW-2 | 10kW | 2kW | 0kW | 2kW | 2kW | 2kW | 2kW | 1 sec | |
| | | MW-3 | 10kW | 2kW | 2kW | 0kW | 2kW | 2kW | 2kW | 1 sec | |
| | | MW-4 | 10kW | 2kW | 2kW | 2kW | 0kW | 2kW | 2kW | 1 sec | |
| | | MW-5 | 10kW | 2kW | 2kW | 2kW | 2kW | 0kW | 2kW | 1 sec | |
| | | MW-6 | 10kW | 2kW | 2kW | 2kW | 2kW | 2kW | 0kW | 1 sec | |
| Annealing | MW irradiation | MW-1 | 10kW | 0kW | 2kW | 2kW | 2kW | 2kW | 2kW | 1 sec | Repeated 2.5 cycles for 15 sec / Repeated 4 cycles Processing time: 200 sec (50 sec × 4 cycles) MW irradiation: 60 sec (15 sec × 4 cycles) |
| | | MW-2 | 10kW | 2kW | 0kW | 2kW | 2kW | 2kW | 2kW | 1 sec | |
| | | MW-3 | 10kW | 2kW | 2kW | 0kW | 2kW | 2kW | 2kW | 1 sec | |
| | | MW-4 | 10kW | 2kW | 2kW | 2kW | 0kW | 2kW | 2kW | 1 sec | |
| | | MW-5 | 10kW | 2kW | 2kW | 2kW | 2kW | 0kW | 2kW | 1 sec | |
| | | MW-6 | 10kW | 2kW | 2kW | 2kW | 2kW | 2kW | 0kW | 1 sec | |
| | MW stop | | 0kW | 0kW | 0kW | 0kW | 0kW | 0kW | 0kW | | 35 sec |
| Cooling | | | 0kW | 0kW | 0kW | 0kW | 0kW | 0kW | 0kW | | | even though it was
SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is a Bypass Continuation Application of PCT International Application No. PCT/JP2017/009610, filed on Mar. 9, 2017, the disclosure of which is incorporated herein in its entirety by reference.

TECHNICAL FIELD

The present disclosure relates to a substrate processing apparatus, a method of manufacturing a semiconductor device, and a recording medium.

BACKGROUND

As a process of manufacturing a semiconductor device, there is available, for example, a modifying process represented by an annealing process for heating a substrate in a process chamber through the use of a heating device to change a composition or crystal structure in a thin film formed on the surface of the substrate or to restore a crystal defect or the like in the formed thin film. In recent semiconductor devices, miniaturization and high integration have become remarkable. Accordingly, it is required to perform a modifying process to a high-density substrate on which a pattern having a high aspect ratio is formed. As a method for modifying such a high-density substrate, for example, a heat treatment method using a microwave has been studied.

In the related-art heat treatment using microwaves, a substrate may not be uniformly heated, and a target film may not be uniformly processed.

The present disclosure provides some embodiments of a technique capable of performing uniform substrate processing.

SUMMARY

According to one embodiment of the present disclosure, there is provided a technique that includes: a process chamber in which a substrate is processed; a plurality of microwave supply sources configured to supply predetermined microwaves for heating the substrate in the process chamber; and a controller configured to control the microwave supply sources such that while keeping constant a sum of outputs of the microwaves respectively supplied to the substrate from the plurality of microwave supply sources, at least one of the plurality of microwave supply sources is turned off, and periods in which the at least one of the plurality of microwave supply sources is turned off are different from each other.

BRIEF DESCRIPTION OF DRAWINGS

FIG. 10 is a view for explaining a method of suitably using an electromagnetic wave supply part in a third embodiment of the substrate processing apparatus suitably used in an embodiment of the present disclosure.

FIG. 11 is a view for explaining a microwave irradiation method in a fourth embodiment of the substrate processing apparatus suitably used in an embodiment of the present disclosure.

DETAILED DESCRIPTION

Figure 1:
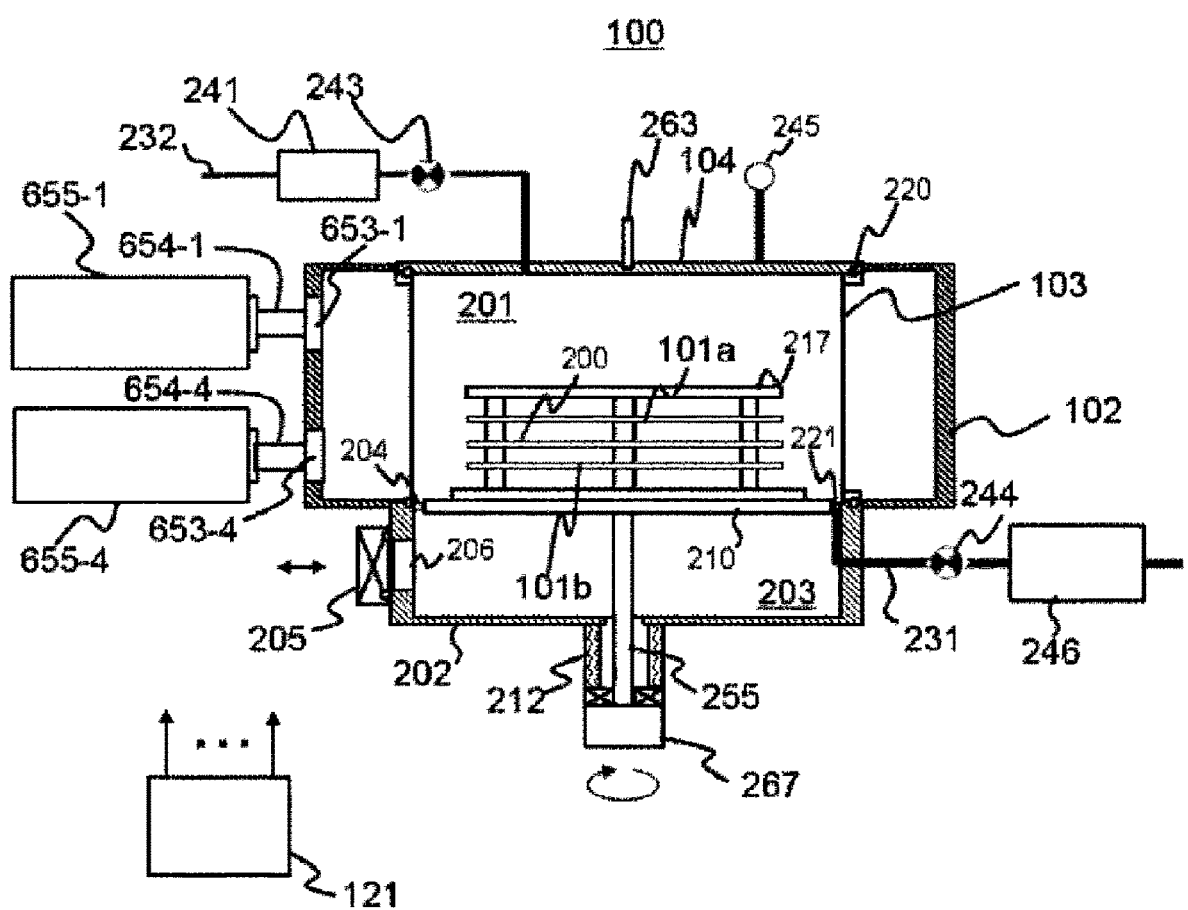
FIG. 1 is a schematic configuration diagram of a single-wafer-type process furnace of a substrate processing apparatus suitably used in an embodiment of the present disclosure, in which a process furnace portion is shown in a vertical sectional view.

Hereinafter, embodiments of the present disclosure will be described with reference to the drawings. In the following description, the same components may be designated by like reference numerals, and the repeated description thereof may be omitted. In the drawings, for the sake of clear descriptions, a width, a thickness, a shape and the like of each part may be schematically represented as compared with actual embodiments. However, this is nothing more than an example and is not intended to limit a construction of the present disclosure.

An Embodiment of the Present Disclosure

An embodiment of the present disclosure will be described below based on the drawings.

(1) Configuration of Substrate Processing Apparatus

In the present embodiment, a substrate processing apparatus 100 according to the present disclosure is configured as a single-wafer-type heat treatment apparatus for performing various heat treatments on a wafer. In the present embodiment, the substrate processing apparatus 100 will be described as an apparatus that performs an annealing process (modifying process) using an electromagnetic wave to be described later.

Process Chamber

As shown in FIG. 1, the substrate processing apparatus 100 according to the present embodiment includes a case 102 as a cavity (upper container) made of an electromagnetic-wave-reflecting material such as a metal or the like, and a cylindrical reaction tube 103 accommodated inside the case 102 with vertical upper and lower end portions thereof opened. The reaction tube 103 is made of an electromagnetic-wave-transmitting material such as quartz or the like. A cap flange (closing plate) 104 made of a metallic material is brought into contact with an upper end of the reaction tube 103 via an O-ring 220 as a sealing member to close the upper end of the reaction tube 103. A process container for processing a substrate such as a silicon wafer or the like is mainly constituted by the case 102, the reaction tube 103 and the cap flange 104. In particular, an internal space of the reaction tube 103 is configured as a process chamber 201. The process container may be constituted by the case 102 and the cap flange 104 without installing the reaction tube 103. In that case, an internal space of the case 102 becomes the process chamber 201. In addition, without installing the cap flange 104 and by using a case 102 having a closed ceiling, the process container may be constituted by the case 102 and the reaction tube 103, or may be constituted by the case 102.

A mounting stand 210 is installed below the reaction tube 103, and a boat 217 as a substrate holder for holding a wafer 200 as a substrate is mounted on the upper surface of the mounting stand 210. In the boat 217, a wafer 200 to be processed and quartz plates 101a and 101b as heat insulating plates placed vertically above and below the wafer 200 so as to sandwich the wafer 200 are held at predetermined intervals. Instead of the quartz plates 101a and 101b, it may be possible to mount components having a function as susceptors (also referred to as radiation plates or heat equalizing plates) (not shown), for example, silicon plates (Si plates), silicon carbide plates (SiC plates) or the like, which are made of a material such as a dielectric material or the like self-heated by absorbing an electromagnetic wave and which are configured to indirectly heat the wafer 200. Furthermore, the susceptors may be mounted on the outer side of the wafer 200 and on the inner side of the quartz plate 101a and 101b. That is, the wafer 200 may be sandwiched by the susceptors, and the susceptors may be sandwiched between the quartz plates 101a and 101b (may be disposed between the wafer 200 and the quartz plate 101a and between the wafer 200 and the quartz plate 101b). With this configuration, it is possible to more efficiently and uniformly heat the wafer 200. In the present embodiment, the quartz plates 101a and 101b are the same component and will be referred to as a quartz plate 101 hereinafter unless there is a need to specifically distinguish them from each other.

In a side wall of the mounting stand 210, a protrusion portion (not shown) protruding in the radial direction of the mounting stand 210 is installed on the side of a bottom surface of the mounting stand 210. This protrusion portion comes close to or makes contact with a partition plate 204 installed between the process chamber 201 and a transfer space 203 to be described later, thereby preventing an atmosphere in the process chamber 201 from moving into the transfer space 203 or preventing the atmosphere in the transfer space 203 from moving into the process chamber 201.

The case 102 as an upper container has, for example, a circular cross section, and is configured as a flat closed container. Furthermore, the transfer container 202 as a lower container is made of a metallic material such as aluminum (Al), stainless steel (SUS) or the like, quartz, or the like. A transfer area (transfer space) 203 for transferring a wafer 200 such as a silicon wafer or the like is formed under the process container. A space surrounded by the case 102 or a space surrounded by the reaction tube 103 and located above the partition plate 204 is sometimes referred to as a process chamber 201 or a reaction area 201 as a process space. A space surrounded by the transfer container 202 and located below the partition plate 204 is sometimes referred to as a transfer area 203 as a transfer space. The process chamber 201 and the transfer area 203 are not limited to being vertically adjacent to each other as in the present embodiment, but may be configured to be adjacent to each other in the horizontal direction. Alternatively, only the process chamber 201 may be installed without installing the transfer area 203.

A substrate loading/unloading port 206 adjacent to the gate valve 205 is installed on the side surface of the transfer container 202. The wafer 200 moves to and from a substrate transfer chamber (not shown) via the substrate loading/unloading port 206.

An electromagnetic wave supply part as a heating device, which will be described in detail later, is installed on the side surface of the case 102. An electromagnetic wave such as a microwave or the like supplied from the electromagnetic wave supply part is introduced into the process chamber 201 to heat the wafer 200 and the like, thereby processing the wafer 200.

The mounting stand 210 is supported by a shaft 255 as a rotating shaft. The shaft 255 penetrates the bottom portion of the transfer container 202. Furthermore, the shaft 255 is connected to a drive mechanism 267 that performs a rotating or elevating operation outside the transfer container 202. By driving the drive mechanism 267 to rotate or elevate the shaft 255 and the mounting stand 210, it is possible to rotate or elevate the wafer 200 placed on the boat 217. The periphery of the lower end portion of the shaft 255 is covered by a bellows 212, whereby the inside of the process chamber 201 and the transfer area 203 are kept airtight.

At the time of transferring the wafer 200, the mounting stand 210 is lowered such that the upper surface of the mounting stand 210 is located at a position (wafer transfer position) corresponding to the substrate loading/unloading port 206. At the time of processing the wafer 200, as shown in FIG. 1, the wafer 200 is raised to the processing position (wafer processing position) in the process chamber 201. When the process chamber 201 and the transfer area 203 are configured to be adjacent to each other in the horizontal direction as described above, or when only the process chamber 201 is installed without installing the transfer area 203, only a mechanism for rotating the mounting stand may be installed without installing a mechanism for raising and lowering the mounting stand.

Exhaust Part

An exhaust part for exhausting the atmosphere in the process chamber 201 is installed below the process chamber 201 and on the outer peripheral side of the mounting stand 210. As shown in FIG. 1, an exhaust port 221 is formed in the exhaust part. An exhaust pipe 231 is connected to the exhaust port 221. A pressure regulator 244 such as an APC valve or the like for controlling a valve opening degree depending on a pressure in the process chamber 201, and a vacuum pump 246 are sequentially and serially connected to the exhaust pipe 231.

In this regard, the pressure regulator 244 is not limited to the APC valve as long as it can receive pressure information in the process chamber 201 (the feedback signal from a pressure sensor 245 to be described later) and can adjust an exhaust amount. The pressure regulator 244 may be configured so as to use an ordinary opening/closing valve and a pressure regulation valve in combination.

An exhaust part (also referred to as an exhaust system or an exhaust line) is mainly constituted by the exhaust port 221, the exhaust pipe 231 and the pressure regulator 244. An exhaust port may be provided to surround the mounting stand 210 so that the gas can be exhausted from the entire periphery of the wafer 200. In addition, the vacuum pump 246 may be added to the configuration of the exhaust part.

Gas Supply Part

In the cap flange 104, there is installed a gas supply pipe 232 for supplying process gases for various substrate processing processes such as an inert gas, a precursor gas, a reaction gas and the like into the process chamber 201.

In the gas supply pipe 232, a mass flow controller (MFC) 241 which is a flow rate controller (flow rate control part) and a valve 243 which is an opening/closing valve are installed sequentially from the upstream side. For example, a nitrogen ($N_2$) gas source for supplying a nitrogen ($N_2$) gas as an inert gas is connected to the upstream side of the gas supply pipe 232. The nitrogen ($N_2$) gas is supplied into the process chamber 201 via the MFC 241 and the valve 243. In the case of using plural kinds of gases at the time of substrate processing, the plural kinds of gases can be supplied by using a configuration in which a gas supply pipe having an MFC as a flow rate controller and a valve as an opening/closing valve installed sequentially from the upstream side is connected to the gas supply pipe 232 on the downstream side of the valve 243. A gas supply pipe provided with an MFC and a valve may be installed for each type of gas.

A gas supply system (gas supply part) is mainly constituted by the gas supply pipe 232, the MFC 241 and the valve 243. When an inert gas is supplied to the gas supply system, the gas supply system is also referred to as an inert gas supply system. As the inert gas, in addition to the $N_2$ gas, it may be possible to use, for example, a rare gas such as an Ar gas, a He gas, a Ne gas, a Xe gas or the like.

Temperature Sensor

On the cap flange 104, there is installed a temperature sensor 263 as a non-contact type temperature measurement device. By adjusting the output of a microwave oscillator 655 to be described below on the basis of the temperature information detected by the temperature sensor 263, it is possible to heat the substrate so that the substrate has a desired temperature distribution. The temperature sensor 263 is constituted by, for example, a radiation thermometer such as an IR (Infrared Radiation) sensor or the like. The temperature sensor 263 is installed so as to measure a surface temperature of the quartz plate 101*a* or a surface temperature of the wafer 200. In the case where the above-described susceptor as a heating element is installed, the temperature sensor 263 may be configured to measure a surface temperature of the susceptor. When the temperature of the wafer 200 (wafer temperature) is referred to in the present disclosure, it may mean a wafer temperature converted by temperature conversion data to be described below, i.e., an estimated wafer temperature, the temperature obtained by directly measuring the temperature of the wafer 200 with the temperature sensor 263, or both.

Figure 2A:
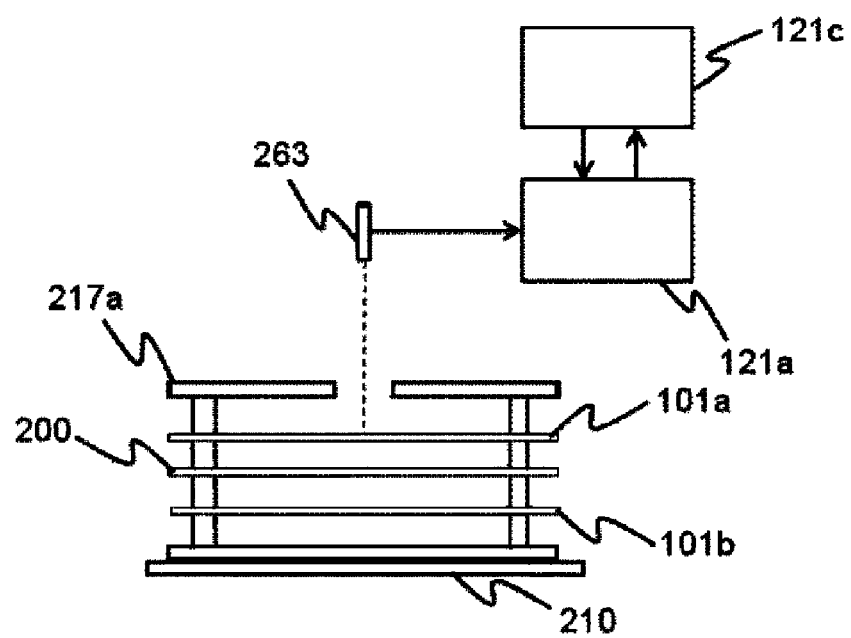
FIG. 2A is a view showing a temperature measurement method of the substrate processing apparatus suitably used in an embodiment of the present disclosure when measuring a temperature of a heat insulating plate.
Figure 2B:
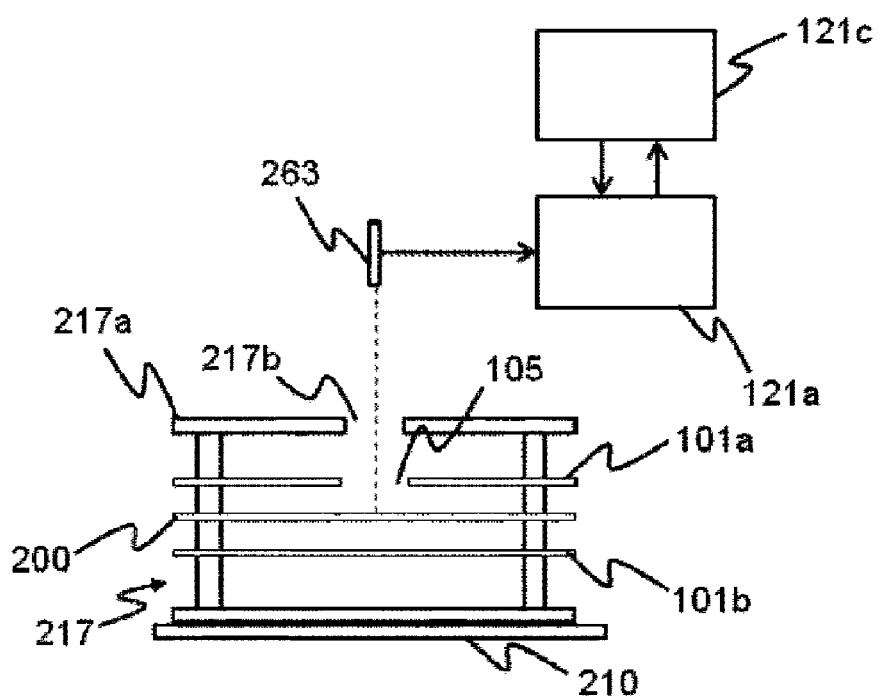
FIG. 2B is a view showing a temperature measurement method of the substrate processing apparatus suitably used in an embodiment of the present disclosure when measuring the temperature of a substrate.

In FIGS. 2A and 2B, there is shown an example of a configuration used when the surface temperature of the quartz plate 101*a* and the wafer 200 is measured using the temperature sensor 263. As shown in FIG. 2A, a measurement hole 217*b* as a temperature measurement window is formed at the position of a top plate 217*a* of the boat 217 facing the temperature sensor 263 such that a ceiling portion (top plate) 217*a* of the boat 217 does not hinder the temperature measurement. The surface temperature of the quartz plate 101*a* is measured through the measurement hole 217*b*. Also in the case of measuring the temperature of the wafer 200, a measurement hole 217*b* of the boat 217 is formed as in the measurement of the temperature of the quartz plate 101*a*, and a measurement hole 105 serving as a measurement window is formed in the quartz plate 101*a*, whereby the surface temperature of the wafer 200 is measured. Temperature measurement of the quartz plate 101 and the wafer 200 may be performed at a preparatory stage before carrying out a substrate processing process, thereby acquiring in advance the transition of a change in the temperature of the quartz plate 101 and the wafer 200 in the substrate processing process in some embodiments. By acquiring the transition of a change in the temperature of the quartz plate 101 and the wafer 200 in this manner, the temperature conversion data indicating the correlation between the temperatures of the quartz plate 101 and the wafer 200 is stored in a memory device 121*c* or an external memory device 123.

By preparing in advance the temperature conversion data as described above, the temperature of the wafer 200 can be estimated merely by measuring the temperature of the quartz plate 101. Based on the estimated temperature of the wafer 200, the output of a microwave oscillator 655, i.e., control of the heating device is performed.

The means for measuring the temperature of a substrate is not limited to the above-described radiation thermometer. Temperature measurement may be performed by using a thermocouple, or may be performed by using both a thermocouple and a non-contact type thermometer. However, when temperature measurement is performed using the thermocouple, it is necessary to arrange the thermocouple near the wafer 200 to perform temperature measurement. That is, it is necessary to arrange the thermocouple in the process chamber 201. Therefore, the thermocouple itself is heated by the microwave supplied from the microwave oscillator described later. This makes it impossible to accurately measure the temperature. Accordingly, it is preferable to use a non-contact type thermometer as the temperature sensor 263.

Furthermore, the temperature sensor 263 is not limited to being installed on the cap flange 104, but may be installed on the mounting stand 210. Moreover, the temperature sensor 263 may not only be directly installed on the cap flange 104 or the mounting stand 210 but also may be configured to indirectly measure the temperature by reflecting radiation light from a measurement window formed in the cap flange 104 or the mounting stand 210 through the use of a mirror or the like. In addition, the temperature sensor 263 is not limited to one. A plurality of temperature sensors may be installed.

Electromagnetic Wave Supply Part

Figure 3:
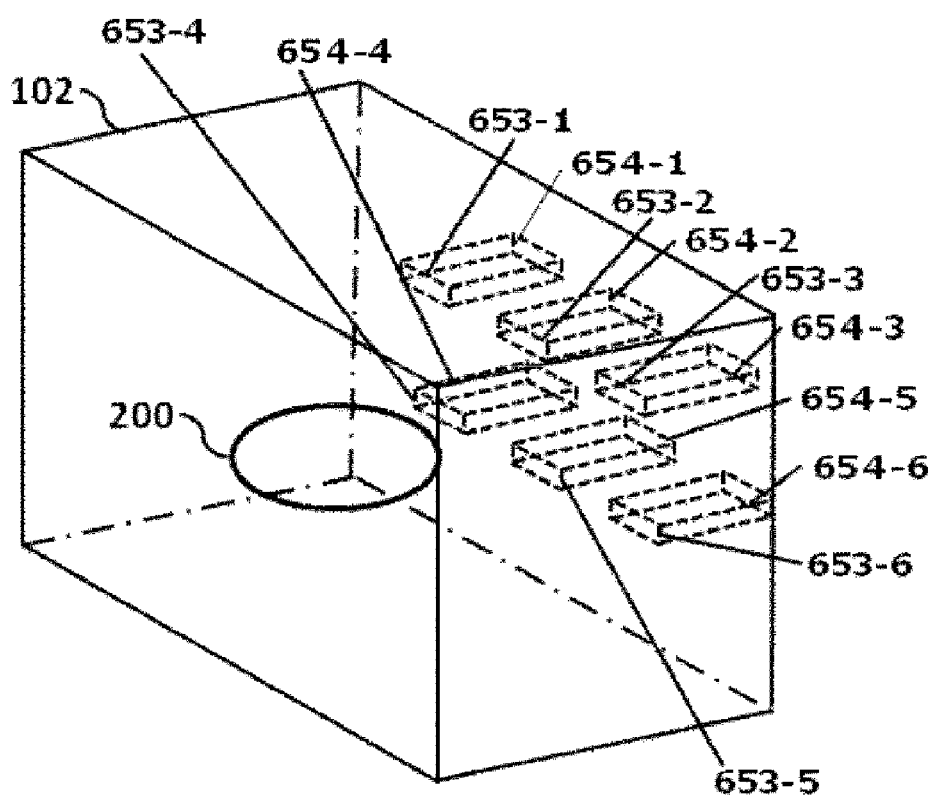
FIG. 3 is a view showing a configuration example of an electromagnetic wave supply part in a case where six electromagnetic wave introduction ports are provided in a case in the substrate processing apparatus shown in FIG. 1.

The illustration of the microwave oscillator is omitted in FIG. 3 to avoid the complexity of the drawing.

Next, the configuration of the electromagnetic wave supply part will be described with reference to FIGS. 1 and 3. In the present embodiment, a structure having six electromagnetic wave supply parts as shown in FIG. 3 will be described by way of example. In FIG. 1, for the sake of convenience, electromagnetic wave introduction ports 653-1 and 653-4, waveguides 654-1 and 654-4, microwave oscillators 655-1 and 655-4, which can be confirmed from the side, are shown by way of example.

As shown in FIGS. 1 to 5, six electromagnetic wave introduction ports (a first introduction port 653-1, a second introduction port 653-2, a third introduction port 653-3, a fourth introduction port 653-4, a fifth introduction port 653-5 and a sixth introduction port 653-6) are provided at one side wall of the case 102. One ends of six waveguides (a first waveguide 654-1, a second waveguide 654-2, a third waveguide 654-3, a fourth waveguide 654-4, a fifth waveguide 654-5 and a sixth waveguide 654-6) for supplying an electromagnetic wave into the process chamber 201 are connected to the first introduction port 653-1 to the sixth introduction port 653-6, respectively. Six microwave oscillators (a first microwave oscillator 655-1, a second microwave oscillator 655-2, a third microwave oscillator 655-3, a fourth microwave oscillator 655-4, a fifth microwave oscillator 655-5 and a sixth microwave oscillator 655-6) serving as heat sources for supplying an electromagnetic wave into the process chamber 201 to perform heating are connected to the other ends of the first waveguide 654-1 to the sixth waveguide 654-6, respectively. The microwave oscillator may be referred to as an electromagnetic wave source (microwave source). Although not shown in FIGS. 4 and 5, as described above, the fourth microwave oscillator 655-4 and the fifth microwave oscillator 655-5 are connected to the other ends of the fourth waveguide 654-4 and the fifth waveguide 654-5, respectively.

Figure 4:
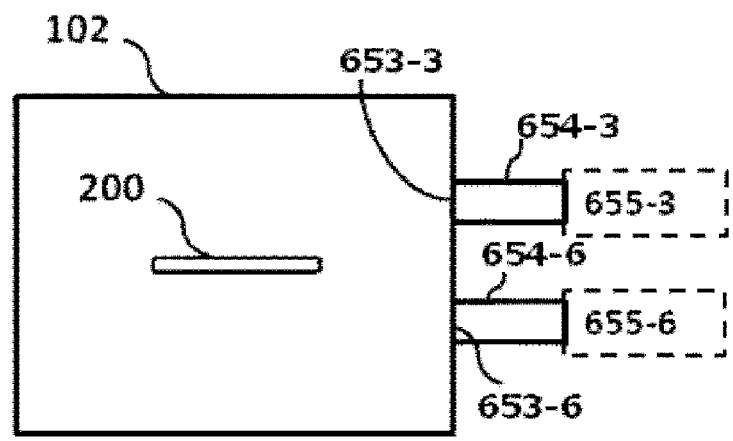
FIG. 4 is a top view of the case shown in FIG. 3.
Figure 5:
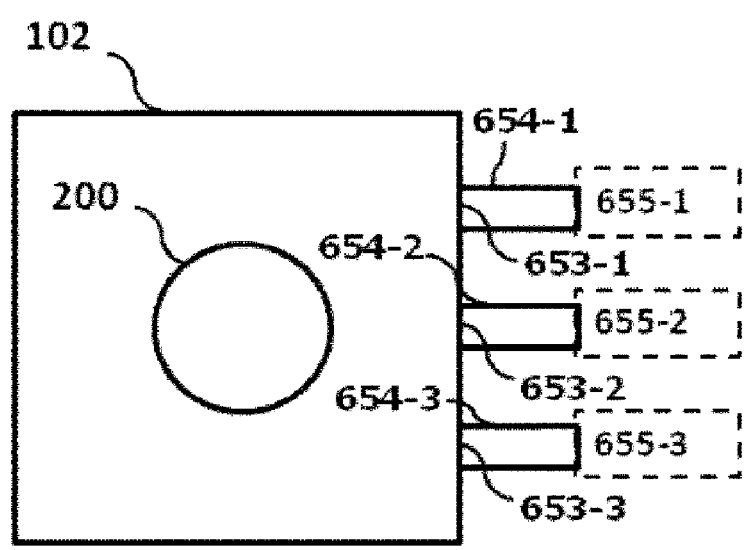
FIG. 5 is a side view of the case shown in FIG. 3.

As shown in FIGS. 3, 4 and 5, in this example, the wafer 200 is disposed substantially at the center of the case 102, i.e., at a height position between the electromagnetic wave introduction ports 653-3 and 653-6 in the side view of FIG. 4, and is disposed substantially at the center of the case 102 in the top view of FIG. 5. Thus, the microwaves supplied from the six electromagnetic wave introduction ports can be irradiated almost uniformly to the upper surface and the lower surface or the entirety of the wafer 200.

Although FIG. 3 shows an example of the electromagnetic wave supply part provided with six electromagnetic wave introduction ports, the number of electromagnetic wave introduction ports may be four. In this case, for example, the electromagnetic wave introduction ports 653-2 and 653-5, the waveguides 654-2 and 654-5, and the microwave oscillators 655-2 and 655-5 are deleted. The electromagnetic wave supply part is configured by four electromagnetic wave introduction ports 654-1, 654-3, 654-4 and 654-6, four waveguides 654-1, 654-3, 654-4 and 654-6, and four microwave oscillators 655-1, 655-3, 655-4 and 655-6. With this configuration, by substantially equally setting the distances from the four electromagnetic wave introduction ports 654-1, 654-3, 654-4 and 654-6 to the wafer 200 accommodated in the case 102 or in the process chamber 201, it is possible to allow the microwaves from the respective electromagnetic wave introduction ports to substantially uniformly act on the wafer 200.

The microwave oscillators 655-1 to 655-6 supply electromagnetic waves such as microwaves or the like to the waveguides 654-1 to 654-6, respectively, and supply electromagnetic waves from the respective introduction ports 653-1 to 653-6 into the process chamber 201 via the respective waveguides 654-1 to 654-6. Furthermore, a magnetron, a klystron, or the like is used for each of the microwave oscillators 655-1 to 655-6. Hereinafter, the electromagnetic wave introduction ports 653-1 to 653-6, the waveguides 654-1 to 654-6, and the microwave oscillators 655-1 to 655-6 will be described and explained as an electromagnetic wave introduction port 653, a waveguide 654, and a microwave oscillator 655, respectively, unless it is particularly required to separately describe them.

The frequency of the electromagnetic wave generated by the microwave oscillator 655 may be controlled so as to fall within a frequency range of from 13.56 MHz to 24.125 GHz in some embodiments. Further, the frequency of the electromagnetic wave may be controlled to become a frequency of 2.45 GHz or 5.8 GHz in some embodiments. In this regard, the frequencies of the microwave oscillators 655-1 to 655-6 may be the same or may be different.

In the present embodiment, six microwave oscillators 655 are arranged on the side surface of the case 102. However, the present disclosure is not limited thereto. One or more microwave oscillators 655 may be provided in first and second embodiments of the present disclosure to be described later. Furthermore, three or more microwave oscillators 655 may be provided in third and fourth embodiments of the present disclosure to be described later. In addition, although the microwave oscillators 655 are provided at one side surface of the case 102, they may be installed on different side surfaces such as the opposing side surfaces of the case 102 and the like.

An electromagnetic wave supply part (also referred to as electromagnetic wave supply device, microwave supply part, or microwave supply device) as a heating device is mainly constituted by the microwave oscillators 655-1 to 655-6, the waveguides 654-1 to 654-6, and the electromagnetic wave introduction ports 653-1 to 653-6.

A controller 121 to be described later is connected to each of the microwave oscillators 655-1 to 655-6. A temperature sensor 263 for measuring the temperature of the quartz plate 101a or 101b or the wafer 200 accommodated in the process chamber 201 is connected to the controller 121. The temperature sensor 263 measures the temperature of the quartz plate 101 or the wafer 200 according to the above-described method and transmits the measured temperature to the controller 121. The controller 121 controls the output of the microwave oscillators 655-1 to 655-6, thereby controlling the heating of the wafer 200. As the method of controlling the heating performed by the heating device, it may be possible to use a method of controlling the heating of the wafer 200 by controlling a voltage inputted to the microwave oscillator 655, a method of controlling the heating of the wafer 200 by changing a ratio of a time to turn on a power supply of the microwave oscillator 655 and a time to turn off the power supply of the microwave oscillator 655, and the like.

In this regard, the microwave oscillators 655-1 to 655-6 are controlled by the same control signal transmitted from the controller 121. However, the present disclosure is not limited thereto. The microwave oscillators 655-1 to 655-6 may be individually controlled by transmitting individual control signals from the controller 121 to the microwave oscillators 655-1 to 655-6.

Control Device

Figure 6:
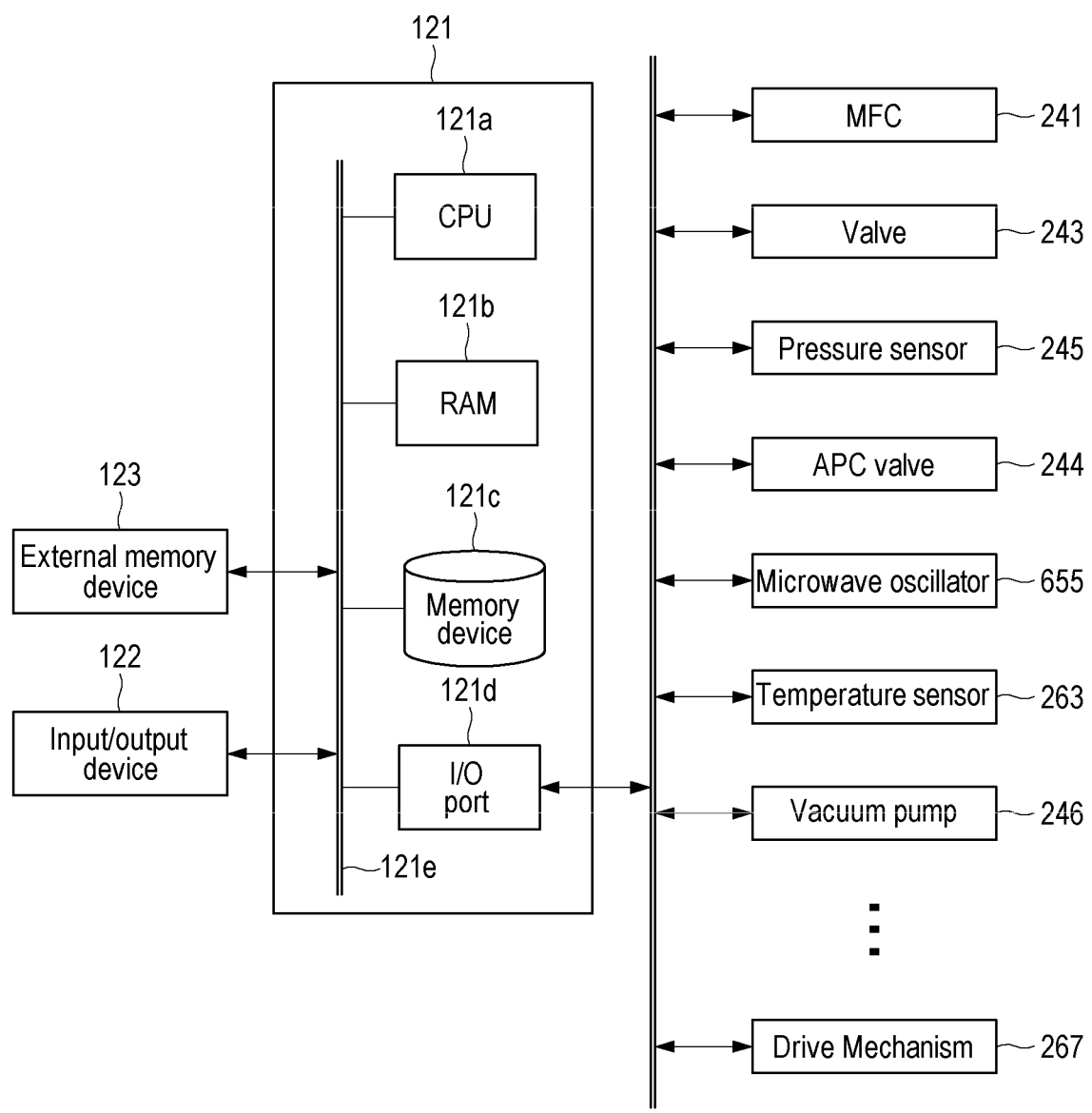
FIG. 6 is a schematic configuration diagram of a controller of a substrate processing apparatus suitably used in the present disclosure.

As shown in FIG. 6, the controller 121 as a controller (control device or control means) is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 formed of, for example, a touch panel or the like is connected to the controller 121.

The memory device 121c is configured by, for example, a flash memory, a hard disc drive (HDD), or the like. A control program for controlling the operations of the substrate processing apparatus, a process recipe in which sequences and conditions of an annealing (modifying) process are written, and the like are readably stored in the memory device 121c. The process recipe functions as a program for causing the controller 121 to execute each sequence in a substrate processing process, which will be described later, to obtain a predetermined result. Hereinafter, the process recipe and the control program will be generally and simply referred to as a "program." When the term "program" is used herein, it may indicate a case of including only the process recipe, a case of including only the control program, or a case of including both the process recipe and the control program. The RAM 121b is configured as a memory area (work area) in which a program or data read by the CPU 121a is temporarily held.

The I/O port 121d is connected to the MFC 241, the valve 243, the pressure sensor 245, the APC valve 244, the vacuum pump 246, the temperature sensor 263, the drive mechanism 267, the microwave oscillator 655, and the like.

The CPU 121a is configured to read the control program from the memory device 121c and execute the same. The CPU 121a is also configured to read the process recipe from the memory device 121c in response to an input of an operation command from the input/output device 122. The CPU 121a is configured to control, according to contents of the process recipe thus read, a flow rate adjustment operation of various gases performed by the MFC 241, an opening/closing operation of the valve 243, a pressure regulation operation performed by the APC valve 244 based on the pressure sensor 245, startup and stop of the vacuum pump 246, an output adjustment operation of the microwave oscillator 655 based on the temperature sensor 263, rotation, rotation speed adjustment or raising/lowering operations of the mounting stand 210 (or the boat 217) performed by the drive mechanism 267, and the like. The output adjustment operation of the microwave oscillator 655 based on the temperature sensor 263 includes the output adjustment operation of the microwave oscillator 655 described with reference to FIGS. 9, 10 and 11.

The controller 121 may be configured by installing, in a computer, the above-described program stored in an external memory device (e.g., a magnetic disk such as a hard disk or the like, an optical disk such as a CD or the like, a magneto-optical disk such as an MO or the like, or a semiconductor memory such as a USB memory or the like) 123. The memory device 121c or the external memory device 123 is configured as a computer-readable recording medium. The program stored in the computer-readable recording medium includes the description on the control of the output adjustment operation of the microwave oscillator 655 to be described with reference to FIGS. 9, 10 and 11. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. The program may be provided to the computer by using a communication means such as the Internet or a dedicated line without using the external memory device 123.

(2) Substrate Processing Process

Figure 7:
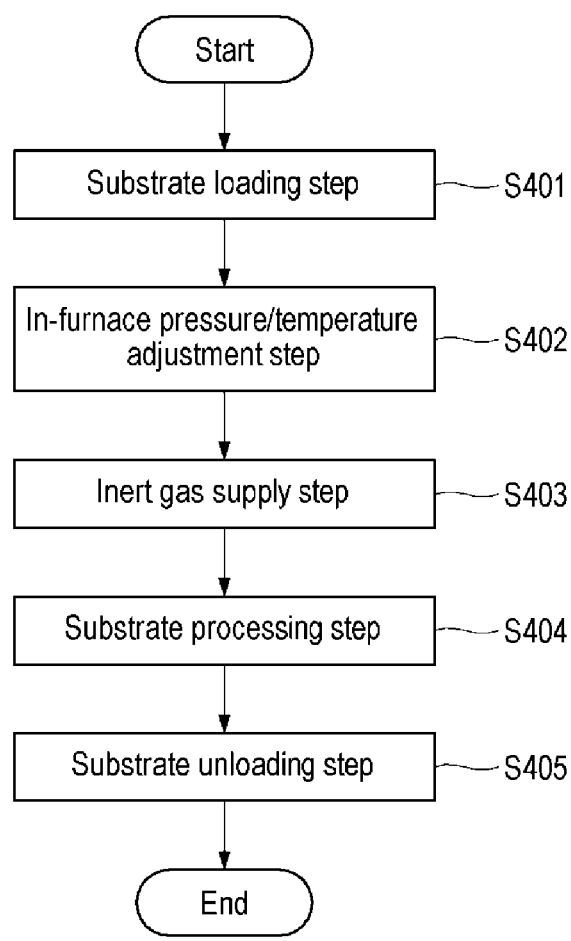
FIG. 7 is a view showing a flow of substrate processing in the present disclosure.

Next, a substrate processing method using a process furnace of the substrate processing apparatus 100 will be described. In the substrate processing method described here, one of processes of manufacturing process a semiconductor device using the process furnace of the above-described substrate processing apparatus 100, for example, an example of a process of modifying (crystallizing) an amorphous silicon film as a silicon-containing film formed on a substrate will be described with reference to a process flow shown in FIG. 7. In the following description, the operations of the respective parts constituting the substrate processing apparatus 100 are controlled by the controller 121.

When the term "wafer" is used herein, it may refer to "a wafer itself" or "a laminated body of a wafer and a predetermined layer or film formed on the surface of the wafer." Furthermore, when the phrase "a surface of a wafer" is used herein, it may refer to "a surface of a wafer itself" or "a surface of a predetermined layer or the like formed on a wafer." Moreover, the expression "a predetermined layer is formed on a wafer" as used herein may mean that "a predetermined layer is directly formed on a surface of a wafer itself" or that "a predetermined layer is formed on a layer or the like formed on a wafer." When the term "substrate" is used herein, it may be synonymous with the term "wafer."

Substrate Loading Step (S401)

As shown in FIG. 1, when a predetermined number of wafers 200 are transferred to the boat 217, the drive mechanism 267 raises the mounting stand 210 to load the boat 217 into the process chamber 201 inside the reaction tube 103 (boat loading) (S401).

In-Furnace Pressure/Temperature Adjustment Step (S402)

After the loading of the boat 217 into the process chamber 201 is completed, the atmosphere in the process chamber 201 is controlled so that the pressure in the process chamber 201 becomes a predetermined pressure (for example, 10 to 102,000 Pa). Specifically, while performing evacuation by the vacuum pump 246, the valve opening degree of the pressure regulator 244 is feedback-controlled based on the pressure information detected by the pressure sensor 245 so that the pressure in the process chamber 201 is set to a predetermined pressure. At the same time, the electromagnetic wave supply part may be controlled to perform pre-heating and may be controlled to perform heating to a predetermined temperature (S402). When the temperature is raised to a predetermined substrate processing temperature by the electromagnetic wave supply part, the temperature raising may be performed by an output smaller than the output of a modifying step to be described below so that the wafer 200 is not deformed or broken in some embodiments. In the case where substrate processing is performed under an atmospheric pressure, after only the in-furnace temperature is adjusted without adjusting the in-furnace pressure, the process may be controlled so as to proceed to an inert gas supply step S403 to be described later.

Inert Gas Supply Step (S403)

After the pressure and the temperature in the process chamber 201 are controlled to predetermined values in the in-furnace pressure/temperature adjustment step S402, the drive mechanism 267 rotates the shaft 255 and rotates the wafer 200 via the boat 217 on the mounting stand 210. At this time, an inert gas such as a nitrogen gas or the like is supplied through the gas supply pipe 232 (S403). Furthermore, at this time, the pressure in the process chamber 201 is adjusted to a predetermined value falling within a range of 10 Pa to 102000 Pa, for example, 101300 Pa or more and 101650 Pa or less. The shaft 255 may be rotated during the substrate loading step S401, i.e., after the wafer 200 has been loaded into the process chamber 201. Moreover, this step may be implemented simultaneously with the in-furnace pressure/temperature adjustment step S402 as an in-furnace pressure adjustment method.

Modifying Step (S404)

When the interior of the process chamber 201 is maintained at a predetermined pressure, the microwave oscillator 655 supplies a microwave into the process chamber 201 via the above-described respective parts. By supplying the microwave into the process chamber 201, the wafer 200 is heated to a temperature of 100 degrees C. or more and 1000 degrees C. or less, 400 degrees C. or more and 900 degrees C. or less in some embodiments, or 500 degrees C. or more and 700 degrees C. or less in some embodiments. By performing the substrate processing at such a temperature, the substrate is processed under the temperature at which the wafer 200 efficiently absorbs the microwave. This makes it possible to increase a speed of the modifying process. In other words, if the wafer 200 is processed at a temperature lower than 100 degrees C. or higher than 1000 degrees C., the surface of the wafer 200 is degraded and is difficult to absorb the microwave. Therefore, it becomes difficult to heat the wafer 200. Accordingly, the substrate processing may be performed in the above-described temperature range. In order to maintain such a temperature range for the substrate processing, a cooling process may be performed during the modifying process (annealing process) in some embodiments.

For example, in the present embodiment in which heating is performed by an electromagnetic wave heating method, a standing wave is generated in the process chamber 201. On the wafer 200 (also the susceptor in the case where the susceptor is placed), there are generated a locally-heated concentrated heating region (hot spot) and a remaining unheated region (non-heating region). By controlling the on/off operation of the power supply of the electromagnetic wave supply part in order to suppress deformation of the wafer 200 (the susceptor in the case where the susceptor is placed), it is possible to suppress generation of a hot spot on the wafer 200.

By controlling the microwave oscillator 655 as described above, the wafer 200 is heated, and the amorphous silicon film formed on the surface of the wafer 200 is modified (crystallized) into a polysilicon film. That is, it becomes possible to uniformly modify the wafer 200. In the case where the measured temperature of the wafer 200 becomes high or low beyond the above-mentioned threshold value, the output of the microwave oscillator 655 may be lowered without turning off the microwave oscillator 655, whereby the temperature of the wafer 200 may be set to fall within a predetermined range. In this case, when the temperature of the wafer 200 returns to the temperature falling within the predetermined range, the output of the microwave oscillator 655 is controlled to become high.

When a preset processing time elapses, the rotation of the boat 217, the supply of the gas, the supply of the microwave and the exhaust through the exhaust pipe are stopped.

Substrate Unloading Step (S405)

After restoring the pressure in the process chamber 201 to the atmospheric pressure, the drive mechanism 267 lowers the mounting stand 210 to open the furnace port and unloads the boat 217 to the transfer space 203 (boat unloading). Thereafter, the wafer 200 placed on the boat is carried out to the transfer chamber located outside the transfer space 23 (S405).

By repeating the above operations, the wafer 200 is modified.

(3) Temperature Control Method

A temperature control method performed by controlling the microwave irradiation method in the in-furnace pressure/temperature adjustment step S402 and the modifying step S404 will be described below with reference to the drawings. In the following description, the output (power) of the microwave oscillator 655 means the input power of microwaves irradiated into the case 102 or the process chamber 201. Furthermore, as shown in FIGS. 1 and 3, when a plurality of microwave oscillators 655-1 to 655-6 is provided, the output of the microwave oscillator 655 means a sum of outputs of microwaves respectively irradiated from the microwave oscillators 655-1 to 655-6 unless otherwise specified.

First Embodiment

Figure 8:
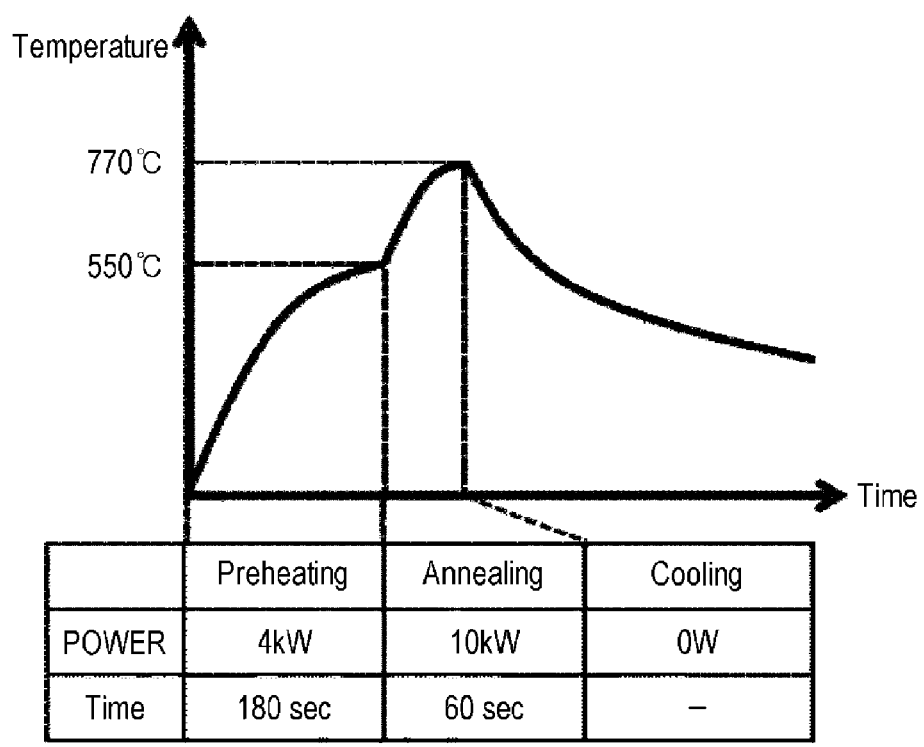
FIG. 8 is a view showing an example of a microwave irradiation method and a substrate temperature transition in a first embodiment of the substrate processing apparatus suitably used in an embodiment of the present disclosure.

A microwave irradiation method in an in-furnace pressure/temperature adjustment step S402 and a modifying step S404 in a first embodiment of the present disclosure will be described with reference to FIG. 8. In FIG. 8, the vertical axis indicates a temperature (T degrees C.), and the horizontal axis indicates a time (sec).

As shown in FIG. 8, in the temperature adjustment step and the modifying step, a preheating process as a temperature adjustment step, an annealing process as a modifying step and a cooling process are sequentially performed.

Referring to FIG. 8, for example, in the preheating process, the output of the microwave oscillator 655 is set to 4 kW, and the microwaves are irradiated to the wafer 200 in the process chamber 201 for 180 seconds. In the annealing process (modifying process) using microwaves, the output of the microwave oscillator 655 is set to 10 kW, and the microwaves are irradiated to the wafer 200 in the process chamber 201 for 60 seconds. In the cooling process, the temperature of the wafer 200 is reduced by setting the output of the microwave oscillator 655 to 0 W. If wafer processing is performed using the microwaves having an output of 10 kW without performing a preheating process before irradiation of the microwaves having an output of 10 kW, the temperature difference in the plane of the wafer 200 becomes large, and the wafer 200 gets distorted. When the degree of distortion is large, the wafer 200 may make contact with, or may cause damage to, the upper and lower wafers 200, the susceptor, the quartz plates 101*a* and 101*b*, or the like. Therefore, a preheating process is performed in order to avoid contact (in order to reduce the temperature difference in the plane of the wafer 200). An annealing process is performed when the temperature difference in the plane of the wafer 200 is made relatively uniform by the preheating process. The temperature of the wafer 200 at this time is raised to 550 degrees C. by the preheating process (with the output of 4 kW for 180 seconds). The temperature of the wafer 200 is raised to 770 degrees C. in the subsequent annealing process (with the output of 10 kW for 60 seconds).

By performing the preheating process in this manner, it is possible to reduce the temperature difference in the wafer plane when performing the annealing process as the modifying step using the microwaves. This is effective in reducing the peak temperature of the wafer in the modifying step.

Second Embodiment

Next, a microwave irradiation method in an in-furnace pressure/temperature adjustment process S402 and a modifying step S404 in a second embodiment of the present disclosure will be described with reference to FIG. 9. The microwave irradiation method of the second embodiment differs from that of the first embodiment in that the irradiation of microwaves and the stop of irradiation of microwaves are alternately repeated in the annealing process of the modifying step so that the processing temperature of the wafer 200 is changed up and down within a certain temperature range. Other points are the same as those in the first embodiment unless otherwise stated.

Figure 9:
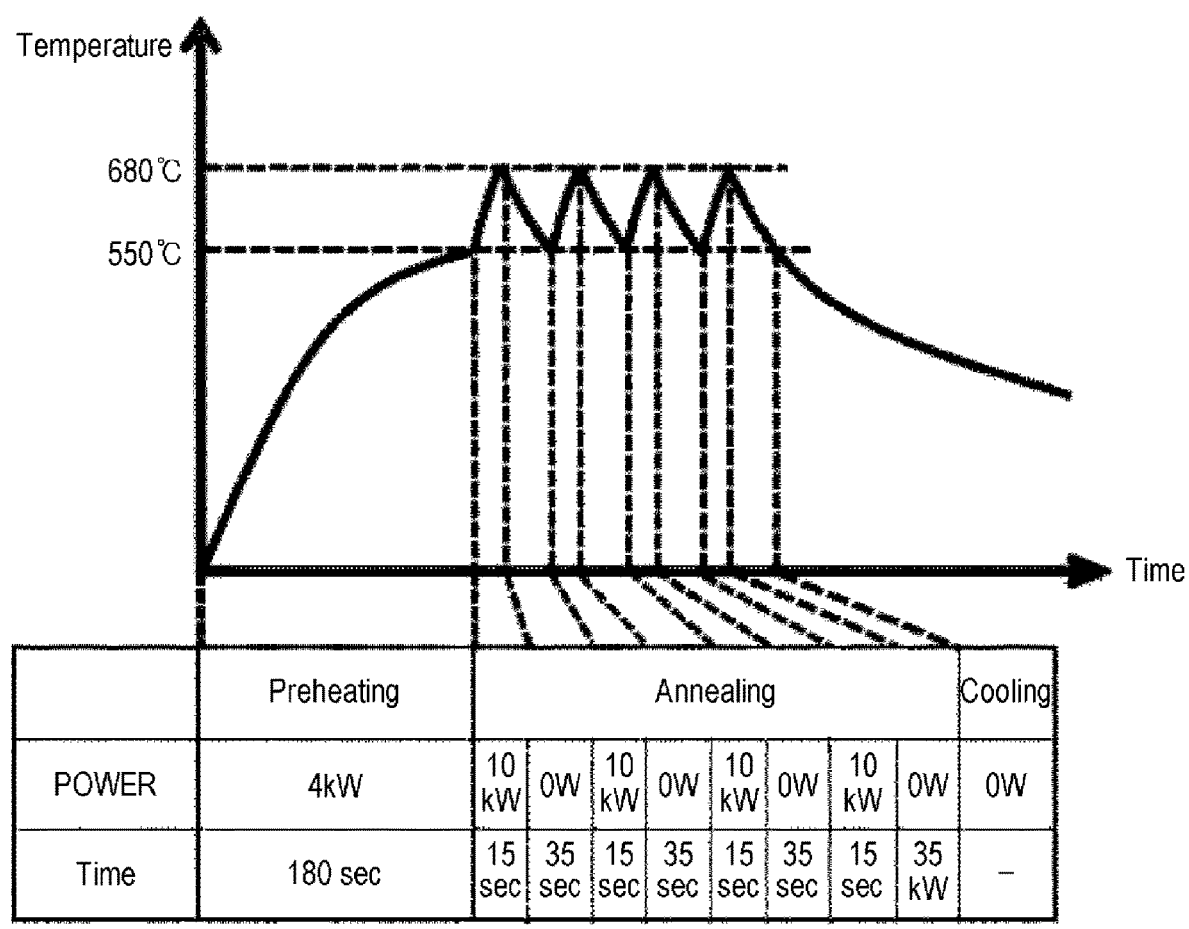
FIG. 9 is a view showing an example of a microwave irradiation method and a substrate temperature transition in a second embodiment of the substrate processing apparatus suitably used in an embodiment of the present disclosure.

In FIG. 9, the vertical axis indicates a temperature (T degrees C.), and the horizontal axis indicates a time (sec).

Referring to FIG. 9, as in the case of FIG. 8, a preheating process, an annealing process and a cooling process are sequentially performed as the temperature adjustment step and the modifying step.

Referring to FIG. 9, in the preheating process, for example, as in the preheating process shown in FIG. 8, the output of the microwave oscillator 655 is set to 4 kW and the microwaves are irradiated to the wafer in the process chamber 201 for 180 seconds. Thus, the temperature of the wafer 200 is raised to about 550 degrees C.

In the annealing process (modifying process) using microwaves, for example, the output of the microwave oscillator 655 is set to 10 kW, and the microwaves are irradiated to the wafer 200 in the process chamber 201 for 15 seconds. Thus, the temperature of the wafer 200 is raised to about 680 degrees C. Thereafter, the irradiation of the microwaves to the wafer 200 is stopped for 35 seconds by setting the output of the microwave oscillator 655 to 0 W. Thus, the wafer temperature is lowered to about 550 degrees C. which is a predetermined temperature. When the wafer temperature drops to the predetermined temperature, the microwave irradiation (output: 10 kW and time: 15 seconds) to the wafer 200 in the process chamber 201 and the stop of the microwave irradiation to the wafer 200 (output: 0 W and time: 35 seconds) are performed again so that the temperature of the wafer 200 is changed up and down within a certain temperature range. One cycle including a temperature raising process in which the temperature of the wafer 200 is raised by turning on the output of the microwave oscillator 655 as described above and a temperature lowering process in which the temperature of the wafer 200 is lowered by turning off the output of the microwave oscillator 655 as described above is performed at least once. In the present embodiment, four cycles in total are performed. By performing four cycles, the total microwave irradiation time at 10 kW becomes 60 seconds (15 seconds×4 times), but the peak temperature of the wafer remains at 680 degrees C. The microwave irradiation time in the annealing process shown in FIG. 9 is the same as the microwave irradiation time (60 seconds) in the annealing process shown in FIG. 8, but the peak temperature (680 degrees C.) of the wafer 200 in FIG. 9 is set 90 degrees C. lower than the peak temperature (770 degrees C.) of the wafer 200 shown in FIG. 8. The control described above is performed by transmitting the temperature of the quartz plate 101 or the wafer 200 measured by the temperature sensor 263 to the controller 121 which is a control unit, and controlling an on-operation time (ON: applying) and an off-operation time (OFF: shutting off) of the power supply of the microwave oscillator 655 by the controller 121 according to the transmitted temperature.

In the cooling process, the output of the microwave oscillator 655 is set to 0 kW, the irradiation of the microwaves to the wafer 200 is stopped, and the temperature of the wafer 200 is lowered. This control is performed by turning off the power supply of the microwave oscillator 655 with the controller 121 that executes a program.

That is, by adjusting the microwave irradiation time, the microwave irradiation stop time, and the number of repetition times thereof with the controller 121, the temperature of the wafer 200 can be adjusted to fall within a desired temperature range (constant temperature range) without adjusting the microwave output. Thus, the peak temperature of the wafer 200 in the annealing process can be lowered. Therefore, it is possible to reduce an influence of heat history on a target film due to the heat conduction from the wafer 200. In addition, it is easy to achieve an effect of selective and local heating of the target film by microwaves. For example, when an amorphous Si film (P-doped Si) film containing phosphorus (P) is used as a target film, the diffusion of P is suppressed by lowering a peak temperature of the wafer 200 in the annealing process. Further, the selective and local heating of the P-doped Si film can be performed by the microwaves. Accordingly, it is possible to sufficiently perform the crystallization and activation of the P-doped Si film.

Hereinafter, the microwave irradiation method of repeatedly performing the irradiation of the microwaves to the wafer 200 and the stop of the irradiation of the microwaves to the wafer 200 will be referred to as interval microwave (MW) irradiation.

Third Embodiment

Next, a microwave irradiation method in an in-furnace pressure/temperature adjustment process S402 and a modifying step S404 in a third embodiment of the present disclosure will be described with reference to FIG. 10. The microwave irradiation method of the third embodiment differs from those of the first and second embodiments in that, in the annealing process of the modifying step, the supply of the microwaves supplied from the plurality of microwave introduction ports is stopped in a predetermined order, the output of the microwaves supplied to the process chamber is made constant, and the microwave supply from all the microwave introduction ports is stopped after generally stopping the microwave supply from the microwave introduction ports. Other points are the same as those of the first and second embodiments unless otherwise stated.

In the following description, the output of microwave of each of the first microwave oscillator 655-1, the second microwave oscillator 655-2, the third microwave oscillator 655-3, the fourth microwave oscillator 655-4, the fifth microwave oscillator 655-5 and the sixth microwave oscillators 655-6 is, for example, 2 kW.

As shown in FIG. 10, in the control process in which the electromagnetic wave supply part is controlled by the controller 121 that executes a program, a processing event (state) of the electromagnetic wave supply part includes a microwave irradiation event and a microwave irradiation stop event. In the subject specification, the term "event" has the meaning of one control unit described in the program of the controller 121 or the meaning of one step of the processing steps in the substrate processing method.

In the present embodiment, the microwave stop event stops the microwave irradiation from all the six microwave introduction ports (the first introduction port 653-1, the second introduction port 653-2, the third introduction port 653-3, the fourth introduction port 653-4, the fifth introduction port 653-5 and the sixth introduction port 653-6).

Even in the present embodiment, the microwave irradiation event includes six events (MW-1, MW-2, MW-3, MW-4, MW-5 and MW-6). For example, when the six events (MW-1, MW-2, MW-3, MW-4, MW-5 and MW-6) are performed in the named order, in the first event MW-1, the output of the microwaves from the first introduction port 653-1 among the six microwave introduction ports is set to 0 kW, and the microwaves having an output of 2 kW are introduced into the case 102 from each of the remaining five introduction ports. Therefore, the total output of the microwaves irradiated into the case 102 is 10 kW. When transitioning from the first event MW-1 to the second event MW-2, the power supply of the first microwave oscillator 655-1 is switched from off to on, and instead, the power supply of the second microwave oscillator 655-2 is switched from on to off. The power supplies of the other microwave oscillators (655-3 to 655-6) remain on. Thus, in the second event MW-2, the output of microwaves from the second introduction port 653-2 among the six microwave introduction ports is set to 0 kW, and the microwaves having an output of 2 kW are introduced into the case 102 from each of the remaining five introduction ports. Therefore, even in this case, the total output of the microwaves irradiated into the case 102 is 10 kW. Similarly to the transition from the first event MW-1 to the second event MW-2, when transitioning from the second event MW-2 to the third event MW-3, the power supply of the second microwave oscillator 655-2 is switched from off to on, and instead, the power supply of the third microwave oscillator 655-3 is switched from on to off. The power supplies of the other microwave oscillators (655-1 and 655-4 to 655-6) remain on. Thus, in the third event MW-3, the output of the microwaves from the third introduction port 653-3 is set to 0 kW, and the microwaves having an output of 2 kW are introduced into the case 102 from each of the remaining five introduction ports. Even in this case, the total output of the microwaves irradiated into the case 102 is 10 kW. When transitioning from the third event MW-3 to the fourth event MW-4, the power supply of the third microwave oscillator 655-3 is switched from off to on, and instead, the power supply of the fourth microwave oscillator 655-4 is switched from on to off. The power supplies of the other microwave oscillators (655-1, 655-2, 655-5 and 655-6) remain on. Thus, in the fourth event MW-4, the output of the microwaves from the fourth introduction port 653-4 is set to 0 kW, and the microwaves having an output of 2 kW are introduced into the case 102 from each of the remaining five introduction ports. Even in this case, the total output of the microwaves irradiated into the case 102 is 10 kW. When transitioning from the fourth event MW-4 to the fifth event MW-5, the power supply of the fourth microwave oscillator 655-4 is switched from off to on, and instead, the power supply of the fifth microwave oscillator 655-5 is switched from on to off. The power supplies of the other microwave oscillators (655-1 to 655-3 and 655-6) remain on. Thus, in the fifth event MW-5, the output of the microwaves from the fifth introduction port 653-5 is set to 0 kW, and the microwaves having an output of 2 kW are introduced into the case 102 from each of the remaining five introduction ports. Even in this case, the total output of the microwaves irradiated into the case 102 is 10 kW. When transitioning from the fifth event MW-5 to the sixth event MW-6, the power supply of the fifth microwave oscillator 655-5 is switched from off to on, and instead, the power supply of the sixth microwave oscillator 655-6 is switched from on to off. The power supplies of the other microwave oscillators (655-1 to 655-4) remain on. Thus, in the sixth event MW-6, the output of the microwaves from the sixth introduction port 653-6 is set to 0 kW, and the microwaves having an output of 2 kW are introduced into the case 102 from each of the remaining five introduction ports. Even in this case, the total output of the microwaves irradiated into the case 102 is 10 kW.

In this way, the on/off operation of the power supply of the microwave oscillator 655 is controlled by the controller 121 which executes a program, and the microwave oscillator whose power supply is to be turned off is shifted in each event. This prevents the output of the microwaves supplied to the case 102 from becoming 0 kW when switching each event.

In addition, a time (period) of microwave irradiation in each event (MW-1, MW-2, MW-3, MW-4, MW-5 or MW-6) is basically the same time (period). This is preferable from the viewpoint of dispersing or reducing the non-uniformity of the electromagnetic field distribution in the case 102 and in the plane of the wafer 200. The present disclosure is not limited thereto. The time (period) of microwave irradiation in each event (MW-1, MW-2, MW-3, MW-4, MW-5 or MW-6) may be set as a different time (period).

That is, the controller 121 that executes a program controls the on/off operation of the power supply of each of the plurality of microwave oscillators (the first microwave oscillator 655-1, the second microwave oscillator 655-2, the third microwave oscillator 655-3, the fourth microwave oscillator 655-4, the fifth microwave oscillator 655-5 and the sixth microwave oscillator 655-6) so that the input power of the microwaves supplied to the wafer 200 is constant (10 kW) in each event (MW-1, MW-2, MW-3, MW-4, MW-5 or MW-6) at the time of microwave irradiation. Such control makes it possible to suppress the concentration of loads on a specific microwave oscillator and to avoid the complexity of control of the microwave oscillator.

In addition, the controller 121 that executes a program performs control so that the off periods (timings) of the power supplies of the plurality of microwave supply sources (the first microwave oscillator 655-1, the second microwave oscillator 655-2, the third microwave oscillator 655-3, the fourth microwave oscillator 655-4, the fifth microwave oscillator 655-5 and the sixth microwave oscillator 655-6) become different in each event (MW-1, MW-2, MW-3, MW-4, MW-5 or MW-6) at the time of microwave (MW) irradiation. That is, the microwave oscillator whose power supply is turned off is shifted in each event (MW-1, MW-2, MW-3, MW-4, MW-5 or MW-6), whereby the output of the microwaves supplied to the case 102 is prevented from becoming 0 kW at the time of switching each event.

The output (input power) of the microwaves supplied to the wafer 200 may be controlled to become 0.5 kW or more and 30 kW or less in some embodiments. In some embodiments, the output (input power) of the microwaves supplied to the wafer 200 may be 1 kW or more and 24 kW or less. Further, the output (input power) of the microwaves supplied to the wafer 200 may be controlled to be 10 kW or more and 24 kW or less in some embodiments. If the input power is lower than 0.5 kW, the temperature of the wafer 200 cannot be raised sufficiently, and the crystal defect of the wafer 200 cannot be repaired. Furthermore, if the input power is higher than 30 kW, plasma may be generated in the case 102 and the wafer 200 may be broken due to plasma damage. In addition, the temperature of the wafer 200 may become too high, which may make it impossible to suppress the diffusion of a dopant (e.g., P atoms).

The intrinsic electromagnetic field distribution in the case 102 varies depending on a difference in frequency, a difference in phase, and a difference in irradiation port. For example, in the first event MW-1 shown in FIG. 10, the microwaves of 2 kw are irradiated from the second introduction port 653-2, the third introduction port 653-3, the fourth introduction port 653-4, the fifth introduction port 653-5 and the sixth introduction port 653-6. In the second event MW-2 shown in FIG. 10, the microwaves of 2 kw are irradiated from the first introduction port 653-1, the third introduction port 653-3, the fourth introduction port 653-4, the fifth introduction ports 653-5 and the sixth introduction port 653-6, respectively. The electromagnetic field distributions in the case 102 in the first event MW-1 and the second event MW-2 become different as the introduction port to be used is changed as described above. Even when the microwaves having the same output (10 kW) are generated from the plurality of microwave oscillators, if the introduction port used is different as in each event (MW-1, MW-2, MW-3, MW-4, MW-5 or MW-6), all the electromagnetic field distributions in the case 102 are different. Furthermore, the microwave oscillators differ in frequency and phase within the product specification range. Therefore, the electromagnetic field distributions in the case 102 are different. The microwave irradiation method described with reference to FIG. 10 takes advantage of such characteristics to repeat the plurality of events (MW-1, MW-2, MW-3, MW-4, MW-5 and MW-6) so that the microwaves can be sequentially irradiated from the plurality of introduction ports. In other words, the plurality of microwave oscillators (the first microwave oscillator 655-1, the second microwave oscillator 655-2, the third microwave oscillator 655-3, the fourth microwave oscillator 655-4, the fifth microwave oscillator 655-5 and the sixth microwave oscillator 655-6) are turned off in a predetermined order to repeat multiple events (MW-1, MW-2, MW-3, MW-4, MW-5 and MW-6) to irradiate microwaves. This makes it possible to disperse or reduce non-uniformity of the electromagnetic field distribution in the case 102 and in the plane of the wafer 200, thereby reducing the generation of the aforementioned hot spot. In the present embodiment, as described above, the microwave irradiation events are performed in the order of MW-1, MW-2, MW-3, MW-4, MW-5 and MW-6. However, the present disclosure is not limited thereto. The order may be changed as appropriate according to a diameter of the wafer 200 or the type of the film formed on the surface of the wafer 200, i.e., the process recipe. For example, the microwave irradiation events may be performed in the order of MW-1, MW-3, MW-5, MW-2, MW-4 and MW-6.

By applying the microwave irradiation method described with reference to FIG. 10 to the annealing process (interval microwave irradiation) shown in FIG. 9, it is possible to reduce the generation of a hot spot in the plane of the wafer 200. Therefore, it is possible to make uniform the processing in the plane of the wafer 200.

Furthermore, by applying the microwave irradiation method described with reference to FIG. 10 to the temperature raising time (temperature adjustment step) of the initial stage of microwave irradiation, it is possible to reduce the generation of a hot spot in the plane of the wafer 200. Therefore, it is possible to reduce distortion of the semiconductor substrate.

In the subject specification, the event of microwave irradiation in the microwave irradiation method described with reference to FIG. 10 is referred to as cycle microwave (MW) irradiation.

Fourth Embodiment

Next, a microwave irradiation method in an in-furnace pressure/temperature adjustment process S402 and a modifying step S404 in a fourth embodiment of the present disclosure will be described with reference to FIGS. 11 and 12. The microwave irradiation method of the fourth embodiment differs from that of the third embodiment in that, even in the preheating process, the supply of the microwaves supplied from the plurality of microwave introduction ports is stopped in a predetermined order and the output of the microwaves supplied to the process chamber is made constant. Other points are the same as those of the first, second, and third embodiments unless otherwise stated. As described below, in the fourth embodiment, the above-described cycle microwave (MW) irradiation is repeatedly performed in the preheating process, and a combination of the repetition of the above-mentioned cycle microwave (MW) irradiation and the event of the microwave stop is repeatedly performed in the annealing process of the modifying step.

Figure 12:
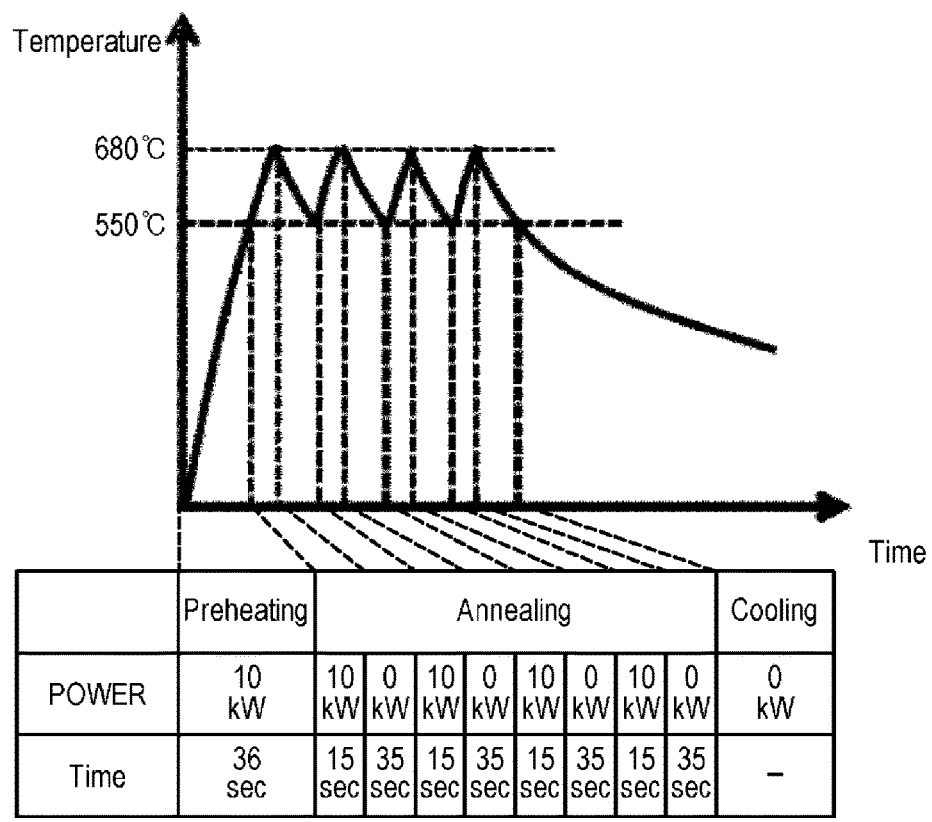
FIG. 12 is a view showing an example of a substrate temperature transition in the microwave irradiation method shown in FIG. 11.

As shown in FIGS. 11 and 12, the events of the microwave irradiation of the preheating process include six events (MW-1, MW-2, MW-3, MW-4, MW-5 and MW-6) as shown in FIG. 10. In each event, the output of microwave is 10 kW and the microwave (MW) irradiation time is 1 second. The six events (MW-1, MW-2, MW-3, MW-4, MW-5 and MW-6) implemented in a predetermined order to form one cycle are sequentially performed. The six events (MW-1, MW-2, MW-3, MW-4, MW-5 and MW-6) are repeatedly performed by at least one cycle or more, e.g., by six cycles in total in the present embodiment. Therefore, the total time of microwave irradiation in the preheating process is 1 second×6 (events)×6 (cycles)=36 seconds.

As shown in FIGS. 11 and 12, the annealing process includes an event of microwave irradiation and an event of stop of microwave irradiation. Similar to the microwave irradiation event shown in FIG. 10 or the microwave irradiation event of the preheating process shown in FIG. 11, the events of the microwave irradiation of the annealing process include six events (MW-1, MW-2, MW-3, MW-4, MW-5 and MW-6) as shown in FIG. 10. In each event, the output of microwave is 10 kW and the microwave (MW) irradiation time is 1 second. The six events (MW-1, MW-2, MW-3, MW-4, MW-5 and MW-6) implemented in a predetermined order to form one cycle are sequentially performed. The six events (MW-1, MW-2, MW-3, MW-4, MW-5 and MW-6) are repeatedly performed by at least one cycle or more, e.g., by 2.5 cycles in total in the present embodiment. Therefore, the total time of microwave irradiation is 1 second×6 (events)×2.5 (cycles)=15 seconds. The event of stop of microwave irradiation in the annealing process is 35 seconds as in FIG. 9. This control is performed by the controller 121. The controller 121 that executes a program performs the event of stop of microwave irradiation of the annealing process, namely controls the plurality of microwave oscillators so as to turn off all the microwave supply sources, after confirming that the plurality of microwave oscillators (the first microwave oscillator 655-1, the second microwave oscillator 655-2, the third microwave oscillator 655-3, the fourth microwave oscillator 655-4, the fifth microwave oscillator 655-5 and the sixth microwave oscillator 655-6) have been turned off in a predetermined order in the event of microwave irradiation of the annealing process.

In the annealing process, a combination of the event of microwave irradiation of 2.5 cycles (15 seconds) and the event of stop of microwave irradiation of 35 seconds implemented as one cycle is repeatedly performed by at least one cycle or more, e.g., by four cycles in total in the present embodiment. Therefore, the total time of microwave irradiation in the annealing process is 15 seconds×4 (cycles)=60 seconds. The processing time of the annealing process is (15 seconds+35 seconds)×4 (cycles)=200 seconds. This control is also performed by the controller 121 that executes a program.

In the cooling process, the output of the microwave oscillator 655 is set to 0 kW, the irradiation of microwaves to the wafer 200 is stopped, and the temperature of the wafer 200 is lowered.

Thus, by adjusting the microwave irradiation time, the microwave irradiation stop time, and the number of repetition times thereof, the temperature of the wafer 200 can be adjusted to fall within a desired temperature range without adjusting the output of the microwave oscillator. By applying the microwave irradiation method to the temperature adjustment step, it is possible to reduce the generation of a hot spot in the plane of the wafer 200. Therefore, it is possible to reduce distortion of the semiconductor substrate. In addition, since the generation of a hot spot in the plane of the wafer 200 can be reduced by applying the microwave irradiation method to the annealing process, it is possible to make uniform the processing in the plane of the wafer 200.

As described above, in the preheating process (temperature raising step), the microwave irradiation is performed by setting the output of microwaves to 10 kW. However, in each event, the cycle microwave (MW) irradiation for 1 second is performed. Therefore, the temperature difference in the plane of the wafer 200 becomes small. In addition, therefore, it is possible to reduce the distortion of the wafer 200.

In addition, as compared with FIG. 9, the processing time of the preheating process is shortened from 180 seconds to 36 seconds by setting the microwave output to 10 kW. Thus, the overall processing time in the temperature adjustment step and the modifying step is also shortened.

When shortening the processing time in the preheating process, as in the fourth embodiment, the output of the electromagnetic wave supply part in the preheating process may be made equal to the output of the electromagnetic wave supply part in the modifying step.

Example of Experimental Result

The results of experiments actually conducted using the aforementioned embodiments will be described below.

Figure 13:
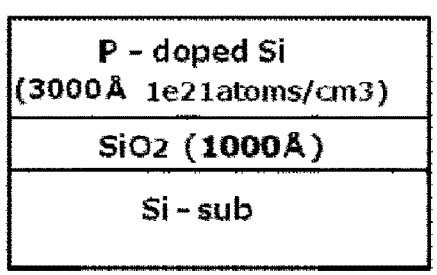
FIG. 13 is a sectional view of processing sample 1 used in an embodiment of the present disclosure.

Processing sample 1 shown in FIG. 13 includes a silicon (Si) substrate (Si-sub), a thermal oxide film $SiO_2$ formed on the Si substrate, and a P-doped Si film formed on the thermal oxide film $SiO_2$. The film thickness of the thermal oxide film $SiO_2$ is about 1000 Å. The thermal oxide film $SiO_2$ is, for example, a Si oxide film formed by diffusing oxygen O on the surface of the Si substrate in an oxygen atmosphere at 900 degrees C. in a vertical substrate processing apparatus provided with a resistance heater. The P-doped Si film has a thickness of about 3000 Å and a P concentration of $1e^{21}$ atoms/cm³. For example, the P-doped Si film is formed in a vertical substrate processing apparatus provided with a resistance heater, by introducing $SiH_4$ (monosilane) and $PH_3$ (phosphine) into a depressurized reaction chamber at a reaction chamber temperature of 500 to 650 degrees C. and depositing them on a substrate transferred into and fixed to the reaction chamber in advance.

Figure 14:
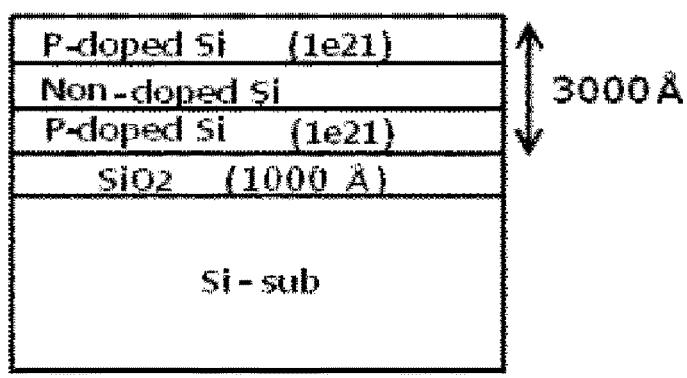
FIG. 14 is a sectional view of processing sample 2 used in an embodiment of the present disclosure.

Processing sample 2 shown in FIG. 14 includes a Si substrate, a thermal oxide film $SiO_2$ formed on the Si substrate, a first P-doped Si film formed on the thermal oxide film $SiO_2$, a phosphorus-free amorphous Si film (Non-doped Si film) formed on the first P-doped Si film, and a P-containing second P-doped Si film formed on the non-doped Si film. The film thickness of the thermal oxide film $SiO_2$ is about 1000 Å. The thermal oxide film $SiO_2$ is, for example, an Si oxide film formed by diffusing oxygen O on the surface of the Si substrate in an oxygen atmosphere at 900 degrees C. in a vertical substrate processing apparatus provided with a resistance heater. The P concentration in the first and second P-doped Si films is $1e^{21}$ atoms/cm³. For example, the first and second P-doped Si films are formed in a vertical substrate processing apparatus provided with a resistance heater, by introducing $SiH_4$ and $PH_3$ into a depressurized reaction chamber at a reaction chamber temperature of 500 to 650 degrees C. and depositing them on a substrate transferred into and fixed to the reaction chamber in advance. For example, the non-doped Si film (amorphous Si film) is formed in a vertical substrate processing apparatus provided with a resistance heater, by introducing $SiH_4$ into a depressurized reaction chamber at a reaction chamber temperature of 500 to 650 degrees C. and depositing it on a substrate previously transferred into and fixed to the reaction chamber. The film thickness of the second P-doped Si film/the non-doped Si film/the first P-doped Si film is about 3000 Å.

Figure 15:
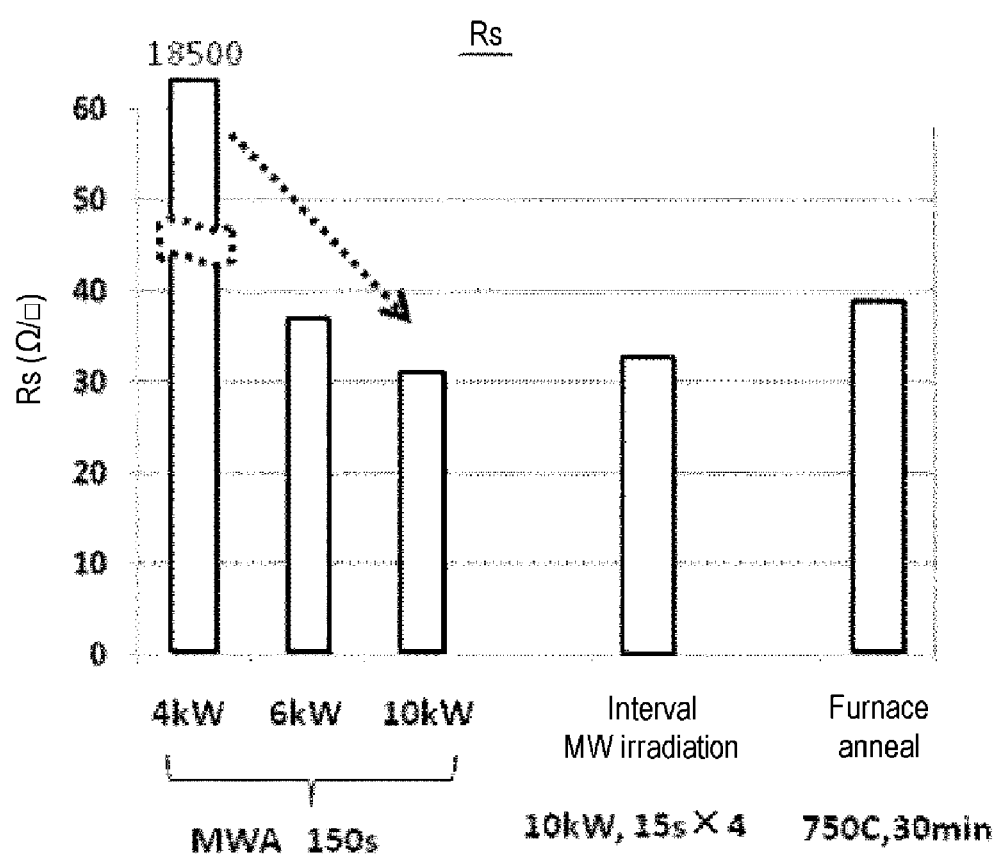
FIG. 15 is a view showing a sheet resistance (Rs) of processing sample 1 used in an embodiment of the present disclosure.
Figure 16:
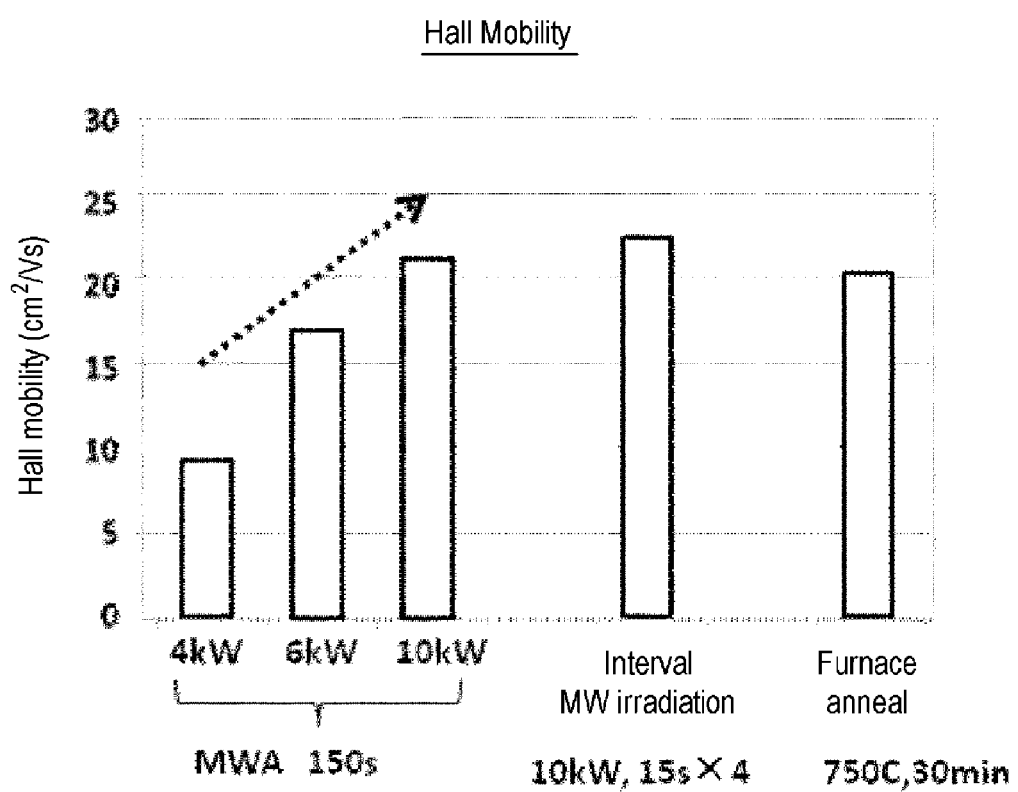
FIG. 16 is a view showing a Hall mobility of processing sample 1 used in an embodiment of the present disclosure.

FIGS. 15 and 16 show the sheet resistance (Rs) and the Hall mobility, respectively, when processing sample 1 is subjected to the microwave annealing (MWA) process described below, the annealing process by the interval microwave irradiation described in the second embodiment, and the furnace annealing (FA) process.

In the MWA process, an annealing process is performed on processing sample 1 for 150 seconds at the microwave outputs of 4 kW, 6 kW and 10 kW.

The annealing process using the interval microwave irradiation is the annealing process (the microwave output: 10 kW, and the microwave irradiation time: 15 seconds×4=60 seconds) described with reference to FIG. 9, which was performed on processing sample 1.

The term "FA" refers to an annealing process in which processing sample 1 as a processing target is processed under the atmospheric pressure in an $N_2$ atmosphere at a desired temperature for a predetermined time in a vertical substrate processing apparatus provided with a resistance heater and the like.

The Rs measured by a four-point probe method is one of the quantities representing the electrical resistance of a thin film or film-like substance having a uniform thickness. The Rs indicates a difficulty in passing electricity through a substance or a material.

As shown in FIGS. 15 and 16, when the processing sample 1 is subjected to the MWA process with the microwave outputs of 4 kW, 6 kW and 10 kW for 150 seconds, the Rs of the P-doped Si film becomes lower as the output of the microwave increases. The Rs is improved to about 30 Ω/☐ at the microwave output of 10 kW. Furthermore, the Hall mobility at this time is also improved as the output of the microwaves increases. The Hall mobility becomes about 21 $cm^2$/Vs at the microwave output (10 kW). The peak temperature of processing sample 1 at this time is 820 degrees C.

Even when processing sample 1 is subjected to the FA process at 750 degrees C. for 30 minutes, Rs and Hall mobility similar to those obtained by the MWA process in the case of the microwave output of 10 kW are obtained. From this, it can be noted that the P-doped Si film is crystallized and activated by performing the annealing process such as the MWA process, the FA process or the like.

When processing sample 1 is annealed by the interval microwave irradiation of the second embodiment, Rs is about 32 Ω/☐, and Hall mobility is about 22 $cm^2$/Vs. From this, it can be noted that, even in the interval microwave irradiation of the second embodiment, the P-doped Si film is sufficiently improved by the crystallization and activation thereof. This is because the temperature of the substrate of processing sample 1 can be controlled to a desired temperature range and can be reduced by the interval microwave irradiation of the second embodiment without changing the microwave irradiation time and the microwave output. Presumably, this is because the heat conduction from the substrate disappears and the effect of microwaves on the P-doped Si film can be maintained.

Figure 17:
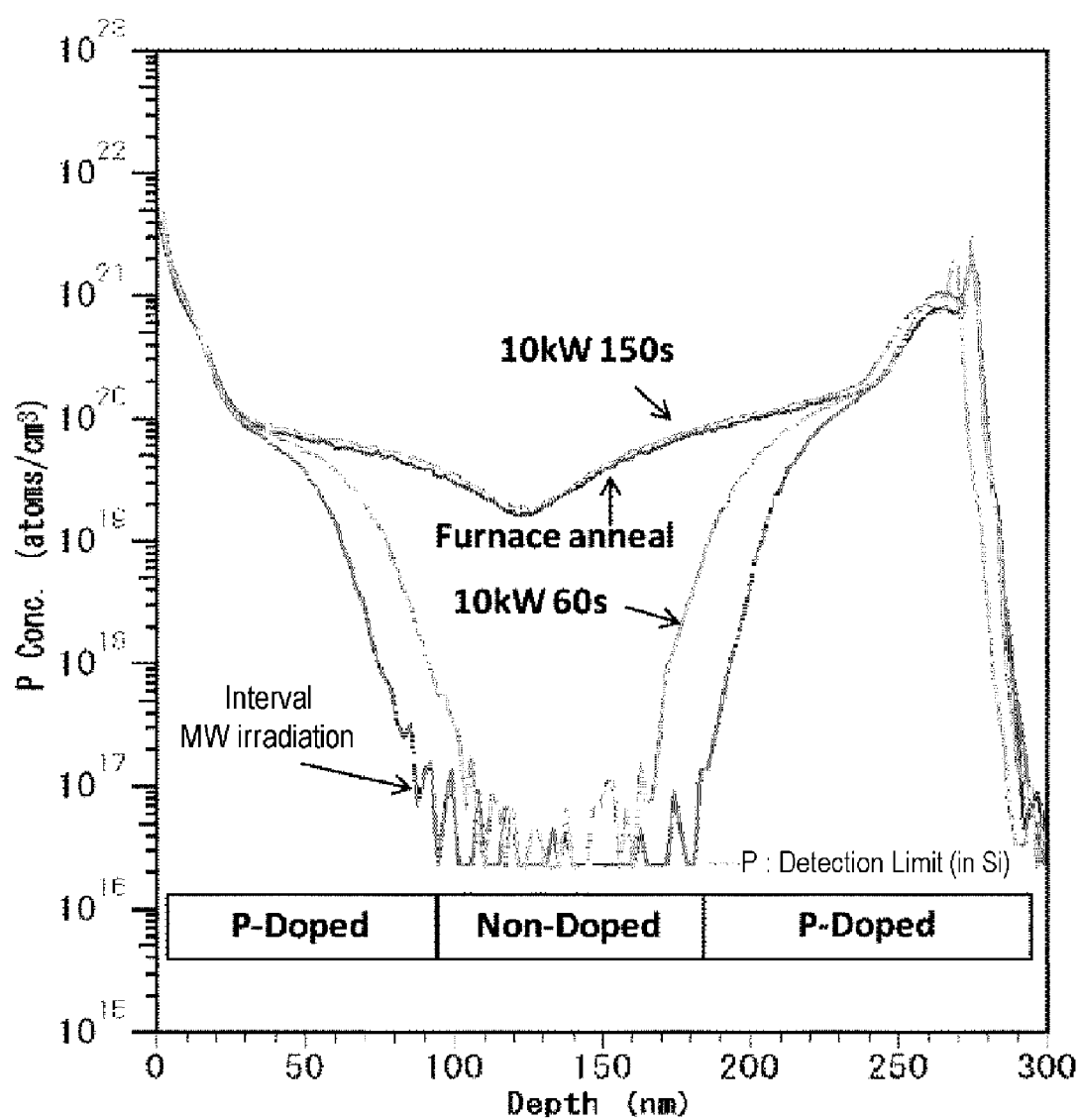
FIG. 17 is a view showing a cross-sectional concentration distribution of phosphorus (P) of processing sample 2 used in an embodiment of the present disclosure.

FIG. 17 shows a cross-sectional density distribution of P measured by SIMS (Secondary Ion Mass Spectrometry) when processing sample 2 is subjected to the MWA performed under the following conditions, the FA, and the annealing process performed by the interval microwave irradiation of the second embodiment.

In the MWA shown in FIG. 17, an annealing process for 150 seconds (150 s) with the microwave output of 10 kW and an annealing process for 60 seconds (60 s) with the microwave output of 10 kW (corresponding to the annealing process of the first embodiment) are performed on the processing sample 2.

Similarly, in the annealing process by the interval microwave irradiation shown in FIG. 17, the annealing process (the microwave output: 10 kW, and the microwave irradiation time: 15 seconds×4=60 seconds) described in the second embodiment is performed on processing sample 2. Furthermore, similarly, in the FA shown in FIG. 17, an annealing process is performed at 750 degrees C. for 30 minutes.

As shown in FIG. 17, in the MWA performed with a microwave output of 10 kW and a processing time of 150 seconds, P is diffused from the first and second P-doped Si films to the phosphorus-free amorphous Si film (non-doped Si film). Even in the non-doped Si film, the P concentration is about $1.5e^{19}$ atoms/$cm^3$. This indicates that P is diffused throughout the film without much difference from the P concentration obtained by the FA. This is because, in the MWA or the FA performed with a processing time of 150 seconds, the substrate surface or the film surface is heated by the radiation from a resistance heater and the inside of the substrate or the film is heated by the heat transfer from the surface, whereby annealing is performed by a predetermined temperature. In other words, it is considered that P is easily diffused because heating is performed in a state in which the substrate temperature and the film temperature substantially match or in a state in which the outside is higher in temperature.

On the other hand, the diffusion of P can be suppressed in the annealing process performed by the MWA (corresponding to the annealing process of the first embodiment) and the interval microwave irradiation of the second embodiment for 60 seconds with a microwave output of 10 kW. Moreover, in the annealing process performed by the interval microwave irradiation of the second embodiment, the diffusion of P can be further suppressed as compared with the MWA performed for 60 seconds with a microwave output of 10 kW, which corresponds to the annealing process of the first embodiment. The reason for this is as follows. The interval microwave irradiation of the second embodiment suppresses the increase in the temperature of the substrate of processing sample 2 as compared with the case where the above-described MWA for continuing the irradiation of microwaves is performed for 60 seconds. Thus, selective and local heating to the first and second P-doped Si films by the action of microwaves can be performed to suppress P diffusion.

(4) Effects of the Present Embodiment

According to the present embodiment, one or more of the following effects may be obtained.

1) The controller 121 controls the heating of the wafer 200 by changing the ratio of the on-operation time and the off-operation time of the power supply of the microwave oscillator 655 based on the measured temperature of the wafer 200. This makes it possible lower the peak temperature of the wafer 200 in the annealing process. Furthermore, it is possible to suppress the generation of a hot spot on the wafer 200 and to suppress the deformation of the wafer (the susceptor as well as the wafer 200 when the susceptor is mounted).

2) Since the peak temperature of the wafer 200 in the annealing process can be lowered as in the above 1), it is possible to reduce the influence of the heat history on the target film due to the heat conduction from the wafer 200. In addition, it is easy to obtain the effect of selective and local heating of the target film by microwaves.

3) Since the generation of a hot spot on the wafer 200 can be suppressed as in the above 1), it is possible to make uniform the processing in the plane of the wafer 200.

4) Since the deformation of the wafer 200 (the susceptor as well as the wafer 200 when the susceptor is mounted) can be suppressed as in the above 1), it is possible to make relatively high the output of microwaves in the preheating process as the temperature adjustment step and to shorten the microwave irradiation time.

5) As in the above 1), the on/off operation of the power supply of the microwave oscillator 655 is controlled by the controller 121. Since complex control such as controlling the output of the microwave oscillator is not performed, it is possible to avoid the control complexity of the controller 121.

6) The plurality of microwave oscillators is provided, and the controller 121 is caused to control the microwave irradiation as a plurality of events. The controller 121 controls the on/off operation of the power supplies of the plurality of microwave oscillators so that the input power of the microwaves supplied to the wafer 200 becomes constant in each event at the time of microwave irradiation. Such control makes it possible to suppress the concentration of loads on a specific microwave oscillator and to avoid the complexity of control of the microwave oscillator.

7) In the above 6), the controller 121 performs control so that the off-operation periods of the power supplies of the plurality of microwave supply sources differ from one another in the respective events at the time of microwave irradiation. The microwave oscillator whose power supply is turned off is shifted in each event. This makes it possible to prevent the output of the microwaves supplied to the case 102 from becoming 0 kW when switching the microwave oscillator in each event.

8) In the above 6), by adjusting the microwave irradiation time, the microwave irradiation stop time, and the number of repetition times thereof, the temperature of the wafer 200 can be adjusted to fall within a desired temperature range without adjusting the output of the microwave oscillator. By applying the microwave irradiation method to the temperature adjustment step, it is possible to reduce the generation of a hot spot in the plane of the wafer 200. Therefore, it is possible to reduce distortion of the semiconductor substrate. In addition, since the generation of a hot spot in the plane of the wafer 200 can be reduced by applying the microwave irradiation method to the annealing process, it is possible to make uniform the processing in the plane of the wafer 200.

Other Embodiment of the Present Disclosure

Figure 18:
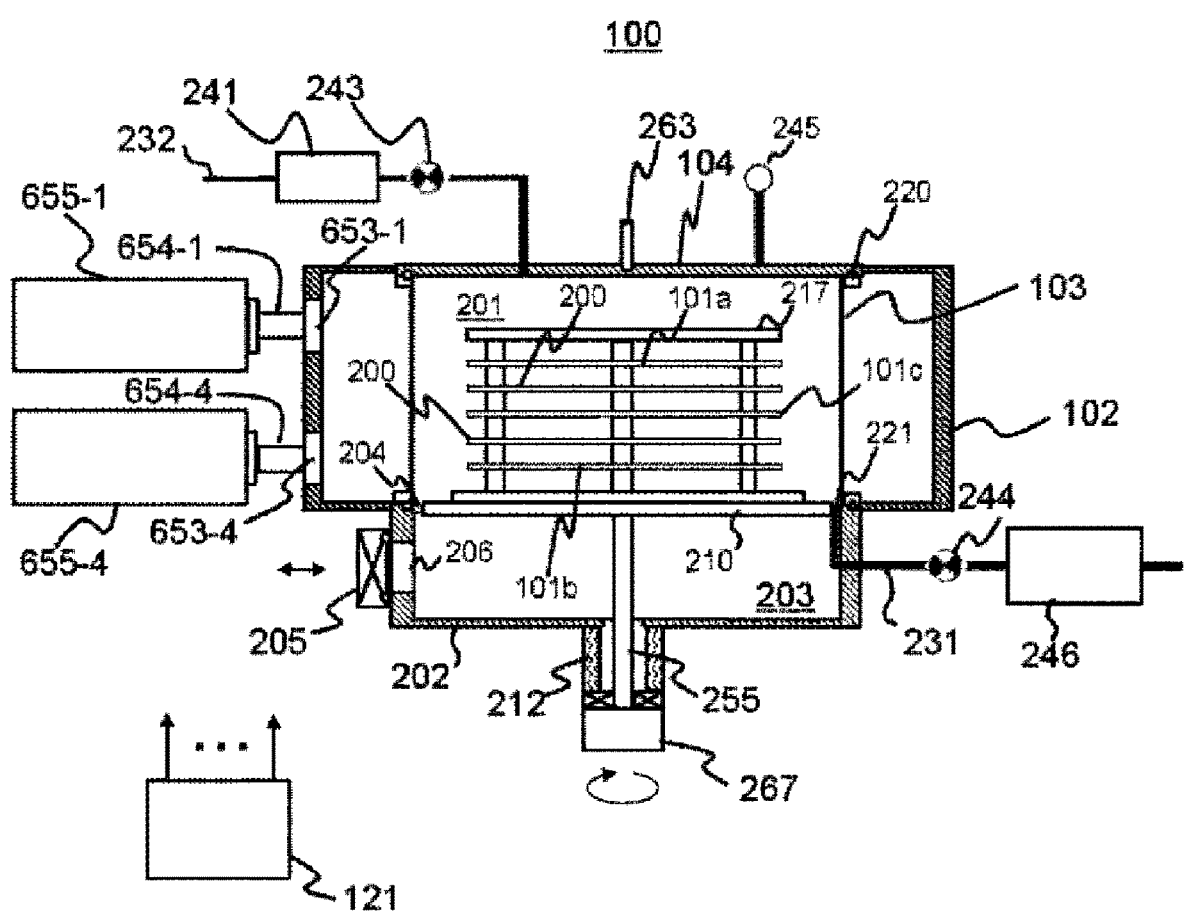
FIG. 18 is a schematic configuration diagram of a vertical batch-type process furnace of a substrate processing apparatus suitably used in another embodiment of the present disclosure, in which a process furnace portion is shown in a vertical sectional view.

As shown in FIG. 18, in the present embodiment, the substrate processing apparatus is configured as a so-called vertical batch type substrate processing apparatus capable of holding a plurality of substrates in multiple stages in the vertical direction in multiple stages. In a boat 217 as a substrate holder, a plurality of wafers 200 as processing targets held in multiple stages in the vertical direction and quartz plates 101a and 101b as heat insulating plates mounted vertically above and below the wafers 200 so as to sandwich the wafers 200 are held at predetermined intervals. Quartz plates 101c as heat insulating plates are provided between the wafers 200 held vertically in multiple stages. Other configurations are the same as those shown in FIG. 1, and the description thereof is omitted.

At this time, instead of mounting the quartz plates 101c as the heat insulating plates, susceptors (not shown) as heating elements to be dielectrically heated by an electromagnetic wave may be mounted, or both the heat insulating plates and the heating elements may be mounted.

First Modification

Figure 19:
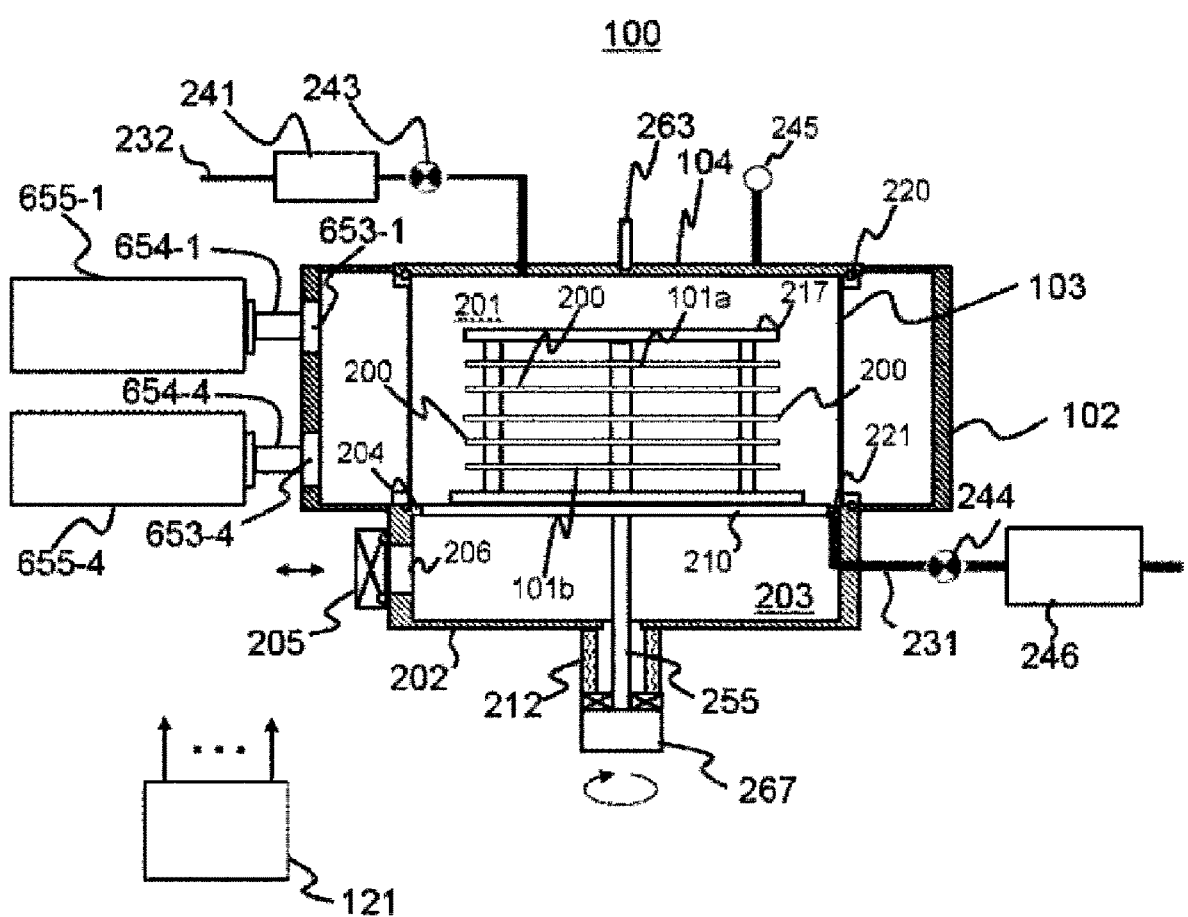
FIG. 19 is a vertical sectional view showing a process furnace portion in a first modification of the substrate processing apparatus suitably used in another embodiment of the present disclosure.

Even in FIG. 19, as in FIG. 18, the substrate processing apparatus is configured as a so-called vertical batch type substrate processing apparatus capable of holding a plurality of substrates in multiple stages in the vertical direction. In a boat 217 as a substrate holder, a plurality of wafers 200 as processing targets held in multiple stages in the vertical direction and quartz plates 101a and 101b as heat insulating plates mounted vertically above and below the wafers 200 so as to sandwich the wafers 200 are held at predetermined intervals. FIG. 19 shows a configuration example in which quartz plates 101c are not provided between the wafers 200. Other configurations are the same as those shown in FIG. 1, and the description thereof is omitted. Although three wafers 200 are held in the boat 217 in the above description, the present disclosure is not limited thereto. For example, a large number of wafers 200 such as 25 wafers or 50 wafers may be processed.

Second Modification

Figure 20:
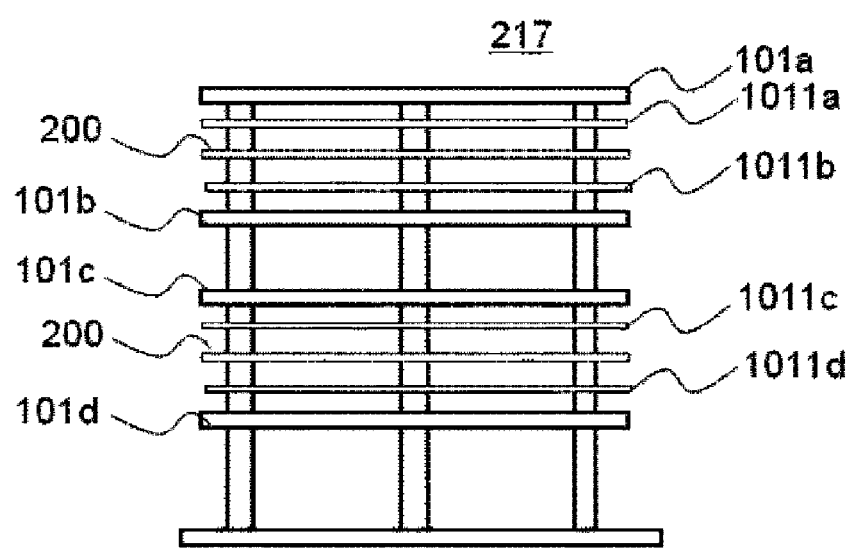
FIG. 20 is a sectional view of a substrate holder in a second modification of the substrate processing apparatus suitably used in another embodiment of the present disclosure.

As shown in FIG. 20, in a boat 217, wafers 200 to be processed are respectively held between quartz plates 101a and 101b as heat insulating plates and between quartz plates 101c and 101d as heat insulating plates. Susceptors 1011a and 1011b as heating elements which are dielectrically heated by electromagnetic waves are respectively held between the wafers 200 and the quartz plates 101a and 101b. Furthermore, susceptors 1011c and 1011d as heating elements which are dielectrically heated by electromagnetic waves are respectively held between the wafers 200 and the quartz plates 101c and 101d.

As shown in FIGS. 18, 19 and 20, by forming the substrate holder that holds the plurality of wafers 200, it becomes possible to process a plurality of substrates and to improve the substrate processing efficiency.

While the present disclosure has been described with reference to the embodiments, the respective embodiments and modifications described above may be used in combination as appropriate and the effects thereof may also be obtained.

For example, in each of the embodiments described above, there has been described the process of modifying an amorphous silicon film as a film containing silicon as a main component into a polysilicon. However, the present disclosure is not limited thereto. The film formed on the surface of the wafer 200 may be modified by supplying a gas containing at least one of oxygen (O), nitrogen (N), carbon C) and hydrogen (H). For example, in the case where a hafnium oxide film ($Hf_xO_y$ film) as a high dielectric film is formed on the wafer 200, a microwave may be supplied to heat the hafnium oxide film while supplying a gas containing oxygen. This makes it possible to supplement the lost oxygen in the hafnium oxide film and to improve the characteristics of the high dielectric film.

Although the hafnium oxide film is shown herein, the present disclosure is not limited thereto. The present disclosure may be suitably applied to a case of modifying an oxide film containing at least one metal element of aluminum (Al), titanium (Ti), zirconium (Zr), tantalum (Ta), niobium (Nb), lanthanum (La), cerium (Ce), yttrium (Y), barium (Ba), strontium (Sr), calcium (Ca), lead (Pb), molybdenum (Mo), tungsten (W) and the like, i.e., a metal-based oxide film.

That is, the aforementioned film-forming sequence may be suitably applied to a case of modifying a TiOCN film, a TiOC film, a TiON film, a TiO film, a ZrOCN film, a ZrOC film, a ZrON film, a ZrO film, a HfOCN film, a HfOC film, a HfON film, a HfO film, a TaOCN film, a TaOC film, a TaON film, a TaO film, a NbOCN film, a NbOC film, a NbON film, a NbO film, an AlOCN film, an AlOC film, an AlON film, an AlO film, a MoOCN film, a MoOC film, a MoON film, a MoO film, a WOCN film, a WOC film, a WON film or a WO film, which is formed on the wafer 200.

In addition to the high dielectric film, a film doped with impurities and containing silicon as a main component may be heated. Examples of the film containing silicon as a main component include Si-based oxide films such as a silicon nitride film (SiN film), a silicon oxide film (SiO film), a silicon oxycarbide film (SiOC film), a silicon oxycarbonitride film (SiOCN film), a silicon oxynitride film (SiON film) or the like. Examples of the impurities include at least one of bromine (B), carbon (C), nitrogen (N), aluminum (Al), phosphorus (P), gallium (Ga), arsenic (As) and the like.

Furthermore, the film may be a resist film based on at least one of a polymethyl methacrylate (PMMA) resin, an epoxy resin, a novolac resin, a polyvinyl phenyl resin and the like.

Although one of processes of manufacturing a semiconductor device has been described above, the present disclosure is not limited thereto but may be applied to a substrate processing technique such as a patterning process of a liquid crystal panel manufacturing process, a patterning process of a solar cell manufacturing process, a patterning process of a power device manufacturing process or the like.

As described above, according to the present disclosure, it is possible to provide an electromagnetic wave heat treatment technique capable of suppressing deformation or breakage of a substrate and performing uniform substrate processing.

According to the present disclosure, it is possible to provide a technique capable of performing uniform substrate processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a process chamber in which a substrate is processed;
a plurality of microwave supply sources configured to supply predetermined microwaves for heating the substrate in the process chamber; and
a controller configured to, while the substrate is processed in the process chamber, control the plurality of microwave supply sources and repeat a predetermined number of times:
performing during a first period of time a temperature-raising act of controlling the plurality of microwave supply sources to turn off at least one microwave supply source among the plurality of microwave supply sources, while keeping constant a sum of outputs of the microwaves respectively supplied to the substrate from the plurality of microwave supply sources; and
performing during a second period of time a temperature-lowering act of controlling the plurality of microwave supply sources to turn off all of the plurality of microwave supply sources,
wherein the controller is further configured to control a temperature of the substrate to fall within a predetermined temperature range by adjusting the first period of time, the second period of time, and a number of repetition times of performing the temperature-raising act and performing the temperature-lowering act.

2. The apparatus of claim 1, wherein the controller is further configured to control the plurality of microwave supply sources so as to turn off all of the plurality of microwave supply sources after the plurality of microwave supply sources are turned off in a predetermined order.

3. The apparatus of claim 1, wherein the controller is further configured to control the plurality of microwave supply sources such that the sum of outputs of the microwaves supplied to the substrate is 0.5 kW or more and 30 kW or less.

4. The apparatus of claim 1, wherein the plurality of microwave supply sources are disposed on a side surface of the process chamber.

5. The apparatus of claim 1, wherein the plurality of microwave supply sources are disposed on a side surface of the process chamber in at least two stages in a vertical direction, and
wherein the substrate in the process chamber is disposed at a height position between the plurality of microwave supply sources disposed in two stages in the vertical direction.

6. The apparatus of claim 1, wherein the plurality of microwave supply sources are disposed at positions equidistant from the substrate in the process chamber.

* * * * *